US007849744B2

(12) United States Patent
Kanai et al.

(10) Patent No.: US 7,849,744 B2
(45) Date of Patent: Dec. 14, 2010

(54) DRIVING DEVICE, PHYSICAL QUANTITY MEASUREMENT DEVICE, AND ELECTRONIC INSTRUMENT

(75) Inventors: Masahiro Kanai, Suwa (JP); Eitaro Otsuka, Fujimi-machi (JP); Naoki Yoshida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 805 days.

(21) Appl. No.: 11/882,203

(22) Filed: Jul. 31, 2007

(65) Prior Publication Data
US 2008/0178672 A1    Jul. 31, 2008

(30) Foreign Application Priority Data
Aug. 2, 2006    (JP) .............................. 2006-210578
Sep. 8, 2006    (JP) .............................. 2006-244008

(51) Int. Cl.
*G01P 15/09*    (2006.01)
(52) U.S. Cl. .................. 73/514.34; 310/317; 310/318; 331/65; 331/116 R
(58) Field of Classification Search ............... 73/11.08; 310/317, 316.01, 318; 331/74, 116 FE, 185, 331/109, 182, 160, 116 R, 65; 323/273
See application file for complete search history.

(56) References Cited

U.S. PATENT DOCUMENTS 4,575,689 A * 3/1986 Valentin ................. 331/116 R
4,578,650 A * 3/1986 Watson ...................... 331/160
5,473,288 A * 12/1995 Kumada ................. 331/116 R
6,031,316 A * 2/2000 Kataoka ................ 310/316.02
2002/0017829 A1 * 2/2002 Raffalt et al. .......... 310/316.01
2006/0192458 A1 * 8/2006 Lee et al. ..................... 310/317

FOREIGN PATENT DOCUMENTS

| JP | A-2002-188925 | 7/2002 |
| JP | A-2002-350139 | 12/2002 |
| JP | A-2003-240556 | 8/2003 |
| JP | A-2004-286503 | 10/2004 |

* cited by examiner

*Primary Examiner*—Walter Benson
*Assistant Examiner*—Bryan P Gordon
(74) *Attorney, Agent, or Firm*—Oliff & Berridge, PLC

(57) ABSTRACT

An oscillation driver circuit includes a gain control amplifier which causes a vibrator to produce driving vibrations by controlling an oscillation amplitude in an oscillation loop, and a comparator which generates a synchronous detection reference signal based on a signal in the oscillation loop. The oscillation driver circuit sets a gain in a first oscillation loop including the vibrator and the comparator to be larger than unity using an output from the comparator, and then causes the vibrator to produce the driving vibrations by controlling an oscillation amplitude in a second oscillation loop including the vibrator and the gain control amplifier in at least one of an oscillation startup state and a sleep mode.

20 Claims, 11 Drawing Sheets

DRIVING DEVICE, PHYSICAL QUANTITY MEASUREMENT DEVICE, AND ELECTRONIC INSTRUMENT

Japanese Patent Application No. 2006-210578 filed on Aug. 2, 2006 and Japanese Patent Application No. 2006-244008 filed on Sep. 8, 2006, are hereby incorporated by reference in their entirety.

BACKGROUND OF THE INVENTION

The present invention relates to a driver device which causes a vibrator to produce driving vibrations, a physical quantity measuring device (e.g. vibrating gyroscope) using the driver device, and an electronic instrument.

Gyroscopes are classified as a rotating gyroscope, a vibrating gyroscope, and the like depending on the method of detecting the force applied to an object. In particular, the vibrating gyroscope is considered to be advantageous for reducing size and cost from the viewpoint of the constituent elements and the like.

As a vibrating gyrosensor which detects the angular velocity applied to an object, a piezoelectric vibrating gyrosensor is known which excites a crystal or a piezoelectric element advantageous for increasing reliability and reducing size. The piezoelectric vibrating gyrosensor utilizes a phenomenon in which a Coriolis force occurs perpendicularly to vibrations when an angular velocity is applied to a vibrating object.

For example, the vibrating gyrosensor which detects an angular velocity causes a physical quantity transducer (vibrator) to produce driving vibrations. When an angular velocity is applied to the vibrator, a Coriolis force occurs perpendicularly to driving vibrations to produce detection vibrations. Since the detection vibrations occur perpendicularly to the driving vibrations, the detection signal (signal component due to the detection vibrations) differs in phase from the driving signal (signal component due to the driving vibrations) by 90 degrees. The detection signal can be synchronously detected separately from the driving signal utilizing the above phenomenon, for example.

The vibrating gyrosensor is used in a wide variety of applications, such as shake detection for a video camera or a digital camera, positioning using a global positioning system (GPS) for a car navigation system, and position detection for an aircraft or a robot.

The vibrating gyrosensor used in these applications is driven by a battery. Therefore, it is necessary to increase the life of the battery by reducing the power consumption of the vibrating gyrosensor as much as possible. In this case, it is preferable to stop supplying power to the vibrating gyrosensor when an angular velocity or the like is not detected and to supply power to the vibrating gyrosensor from the battery only when using the vibrating gyrosensor. This makes it necessary to cause the vibrating gyrosensor to perform a normal operation within a short period of time after activation.

Specifically, it is important to cause the vibrating gyrosensor to promptly transition to the operation state in which the gyrosensor can detect the physical quantity (steady oscillation state) when supplying power (during oscillation startup). For example, when using a vibrator such as a crystal vibrator which has a high Q value and requires a long time until stable oscillations are achieved after supplying power, it is considerably difficult to achieve a high-speed transition to the steady oscillation state.

In order to reduce power consumption, it is preferable to suspend the operation of an unnecessary circuit when the physical quantity such as the angular velocity need not be detected. When providing a low power consumption mode (sleep mode), the circuit must be designed to enable a high-speed recovery from the low power consumption mode (sleep mode) to the normal operation mode.

JP-A-2004-286503 and JP-A-2003-240556 disclose technologies for reducing the startup time of the vibrating gyrosensor, for example.

JP-A-2004-286503 discloses technology in which a CR oscillation circuit or a ring vibrator is provided in an oscillation loop so that the oscillation amplitude is increased by an amplifier immediately after activation.

JP-A-2003-240556 discloses technology in which a resistor is provided in series with a crystal vibrator to reduce the period of time until the signal from the vibrator is stabilized.

A driver device for the vibrating gyrosensor must cause the vibrator to constantly vibrate (oscillate) at a resonance frequency in order to stably detect the angular velocity applied to the vibrator. The driver device also must cause the vibrator to oscillate within a short time to start a normal operation. Furthermore, it is preferable to form the driver device using a small circuit with low power consumption in order to increase the life of the battery at low cost.

On the other hand, if the vibrator is formed of a crystal having a high Q value and sealed in a package under vacuum, the Q value of the vibrator increases to a large extent during drive. Therefore, the period of time (startup time) until the signal from the vibrator is stabilized increases when causing the vibrator to produce driving vibrations.

According to the technology disclosed in JP-A-2004-286503, when causing the crystal vibrator to oscillate at a frequency close to the driving frequency of the crystal vibrator, the areas of the capacitor and the resistor of the CR oscillation circuit must be increased. This results in an increase in the size and cost of the vibrating gyroscope (vibrating gyrosensor).

According to the technology disclosed in JP-A-2004-286503, it is difficult to cause a crystal vibrator with a high Q value to operate at its driving frequency because the crystal vibrator is driven at another frequency during the startup. Therefore, the period of time until stable oscillations are achieved increases when affected by a manufacturing variation and the like.

According to the technology disclosed in JP-A-2004-286503, the vibrator is driven by a rectangular wave after oscillations have occurred. Therefore, the energy is lost even in the steady oscillation state, whereby power consumption increases as compared with the case of driving the vibrator by a sine wave.

A low power consumption mode (sleep mode) may be provided as the operation mode of the driver device aiming at reducing its power consumption so that the operation of the circuit is suspended when unnecessary and the normal operation is recovered quickly when necessary. In particular, when causing a crystal vibrator to oscillate, the oscillation startup time increases due to a high Q value. Therefore, it is necessary to at least cause the crystal vibrator to continuously oscillate in order to reduce the normal operation recovery time.

However, according to the technology disclosed in JP-A-2004-286503, when causing the crystal vibrator to oscillate at a frequency close to the driving frequency of the crystal vibrator, the areas of the capacitor and the resistor of the CR oscillation circuit must be increased. This results in an increase in the size and cost of the vibrating gyroscope (vibrating gyrosensor).

According to the technology disclosed in JP-A-2004-286503, it is difficult to cause a crystal vibrator with a high Q value to operate at its driving frequency because the crystal vibrator is driven at another frequency during startup. Therefore, the period of time until stable oscillations are achieved increases when affected by a manufacturing variation and the like. Therefore, the technology disclosed in JP-A-2004-286503 results in an increase in startup time and power consumption, even if a sleep mode is provided.

The technology disclosed in JP-A-2003-240556 requires that a resistor inserted. In general, when incorporating a resistor in an integrated circuit device, it is difficult to apply the desired energy to the vibrator due to a large manufacturing variation of the resistor. According to the technology disclosed in JP-A-2003-240556, the gain is reduced because the energy applied to the vibrator is divided by the resistor.

Therefore, the technology disclosed in JP-A-2003-240556 results in an increase in startup time and power consumption due to the reduced gain, even if a sleep mode is provided.

SUMMARY

According to one aspect of the invention, there is provided a driver device which is connected with a vibrator to form an oscillation loop and causes the vibrator to produce driving vibrations when measuring a physical quantity using an output signal obtained by synchronously detecting a detection signal output from the vibrator, the driver device comprising:

a gain control amplifier which causes the vibrator to produce the driving vibrations by controlling an oscillation amplitude in the oscillation loop; and a comparator which generates a synchronous detection reference signal based on a signal in the oscillation loop;

the driver device setting a gain in a first oscillation loop including the vibrator and the comparator to be larger than unity using an output from the comparator, and then causing the vibrator to produce the driving vibrations by controlling an oscillation amplitude in a second oscillation loop including the vibrator and the gain control amplifier.

According to another aspect of the invention, there is provided a physical quantity measuring device for measuring a physical quantity corresponding to a detection signal output from a vibrator based on driving vibrations produced by the vibrator and the physical quantity to be measured, the physical quantity measuring device comprising:

a vibrator;

the above driver device which causes the vibrator to produce driving vibrations; and a detection device which detects an output signal corresponding to the physical quantity based on the detection signal, the detection device including a synchronous detector which synchronously detects the detection signal based on the output from the comparator.

According to a further aspect of the invention, there is provided an electronic instrument comprising the above physical quantity measuring device.

DETAILED DESCRIPTION OF THE EMBODIMENT

Figure 1:
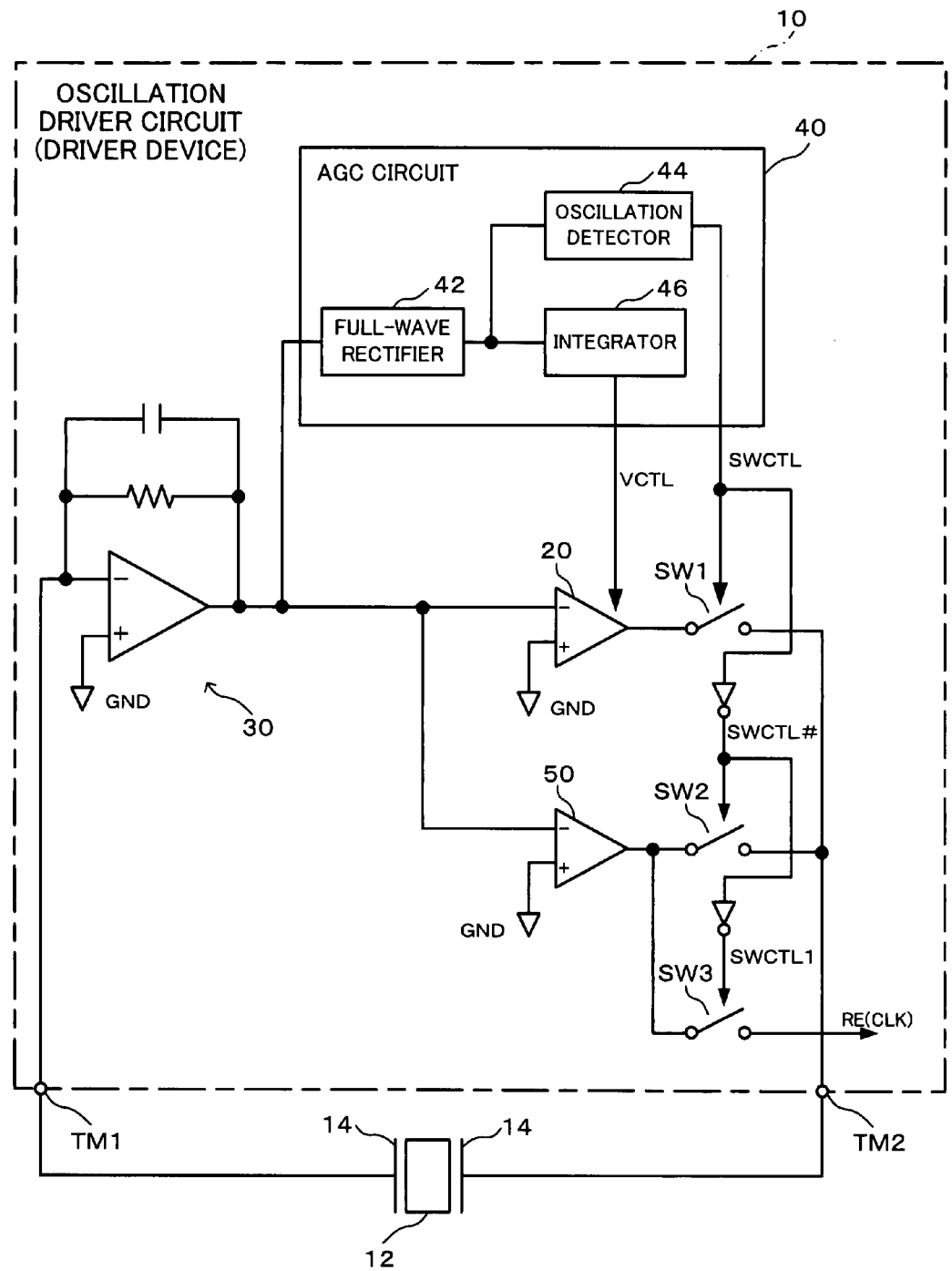
FIG. 1 is a circuit block diagram showing a configuration example of an oscillation driver circuit according to a first embodiment.

At least one aspect of the invention may provide a driver device which can reduce the oscillation startup time without increasing the circuit scale, a physical quantity measuring device and an electronic instrument using the driver device.

At least another aspect of the invention may provide a driver device which achieves a high-speed recovery from a low power consumption mode to a normal operation mode without increasing the circuit scale, a physical quantity measuring device and an electronic instrument using the driver device.

Aspects of the invention are as follows, for example.

According to one embodiment of the invention, there is provided a driver device which is connected with a vibrator to form an oscillation loop and causes the vibrator to produce driving vibrations when measuring a physical quantity using an output signal obtained by synchronously detecting a detection signal output from the vibrator, the driver device comprising:

a gain control amplifier which causes the vibrator to produce the driving vibrations by controlling an oscillation amplitude in the oscillation loop; and a comparator which generates a synchronous detection reference signal based on a signal in the oscillation loop;

the driver device setting a gain in a first oscillation loop including the vibrator and the comparator to be larger than unity using an output from the comparator, and then causing the vibrator to produce the driving vibrations by controlling an oscillation amplitude in a second oscillation loop including the vibrator and the gain control amplifier.

According to this embodiment, when measuring a physical quantity using the output signal corresponding to the detection signal output from the vibrator based on driving vibrations produced by the vibrator and the physical quantity to be measured, the driver device is used to form an oscillation loop together with the vibrator and cause the vibrator to produce driving vibrations.

According to this embodiment, the signal in the oscillation loop is amplified using the comparator which generates the synchronous detection reference signal during oscillation startup (or, in the low power consumption mode), for example. In this case, the gain in the oscillation loop is larger than unity. When the steady oscillation state in the normal operation mode has been achieved, the oscillation loop is switched, whereby the gain in the oscillation loop is controlled by the gain control amplifier so that the gain becomes unity. This enables the synchronous detection process and the oscillation startup to be accelerated.

The steady oscillation state can be more promptly achieved by setting the gain in the oscillation loop to be larger than unity utilizing the comparator.

The output voltage of the comparator generally swings to a maximum between power supply voltages (including a voltage which may be considered to be the power supply voltage). The comparator serves as a synchronous detection reference clock signal generation circuit.

The gain in the oscillation loop can be efficiently set to be larger than unity without providing an additional circuit by utilizing the output from the comparator for driving the vibrator.

According to this embodiment, since the loop gain in the oscillation loop is temporarily set to be larger than unity using the comparator which generates the synchronous detection reference signal, oscillations with an amplitude necessary for steady oscillations can be obtained within an extremely short time. Moreover, the gain in the oscillation loop can be efficiently set to be larger than unity without providing an additional circuit.

As the vibrator drive method, a drive method using a sine wave may be employed, for example. Note that a drive method using a rectangular wave may also be employed.

In the driver device according to this embodiment, the driver device may cause the vibrator to produce vibrations using the first oscillation loop in an oscillation startup state, and may cause the vibrator to produce vibrations using the second oscillation loop in a steady oscillation state.

The first oscillation loop is used in the oscillation startup state, and the second oscillation loop is used in the steady oscillation state. Oscillation startup can be accelerated by selectively using the oscillation loop.

In the driver device according to this embodiment, the driver device may have a first operation mode and a second operation mode as operation modes;

when the driver device is set in the first operation mode, the driver device may set the gain in the first oscillation loop including the vibrator and the comparator to be larger than unity using the output from the comparator, and then may cause the vibrator to produce the driving vibrations by controlling the oscillation amplitude in the second oscillation loop including the vibrator and the gain control amplifier; and when the driver device is set in the second operation mode, the driver device may cause the vibrator to produce the driving vibrations using the first oscillation loop including the vibrator and the comparator.

When the driver device is set in the first operation mode, the signal in the oscillation loop is amplified using the comparator which generates the synchronous detection reference signal during oscillation startup, and the oscillation loop is switched when the steady oscillation state has been achieved. The gain in the oscillation loop is then controlled by the gain control amplifier so that the gain becomes unity. This enables the synchronous detection process and oscillation startup to be accelerated. When the driver device is set in the second operation mode, the oscillation state is maintained in the first oscillation loop (the loop gain is larger than unity) including the vibrator and the comparator. Therefore, oscillation startup when the second operation mode has been canceled can be accelerated.

When the driver device is set in the second operation mode, it is unnecessary to operate the circuit section which controls oscillations in the first operation mode. This reduces power consumption in the second operation mode.

According to this aspect, power consumption in the second operation mode can be reduced while accelerating oscillation startup when the second operation mode has been canceled.

In the driver device according to this embodiment, the first operation mode may be a normal operation mode, and the second operation mode may be a low power consumption mode.

Therefore, unnecessary power consumption can be reduced in the low power consumption mode (sleep mode). Moreover, the driver device can promptly transition to the steady oscillation state in the normal operation when the low power consumption mode has been canceled.

The driver device according to this embodiment may comprise:

an oscillation detector which detects a signal from the vibrator;

wherein the driver device may switch the oscillation loop from the first oscillation loop including the vibrator and the comparator to the second oscillation loop including the vibrator and the gain control amplifier based on a detection result of the oscillation detector.

The oscillation detector is generally used to control oscillations in the oscillation loop. The oscillation detector detects the oscillation state based on the signal from the vibrator. The switching element can be switch-controlled utilizing the detection result of the oscillation state, for example. Therefore, the synchronous detection process and oscillation startup can be accelerated without increasing the circuit scale.

In the driver device according to this embodiment, the driver device may switch the oscillation loop from the first oscillation loop including the vibrator and the comparator to the second oscillation loop including the vibrator and the gain control amplifier based on a detection result of the oscillation detector on condition that the oscillation detector has detected that a direct-current voltage obtained by converting current flowing toward the vibrator has reached a given threshold voltage.

The oscillation detector detects whether or not the direct-current voltage obtained by converting the current flowing toward the vibrator has reached the given threshold voltage. The oscillation state can be determined to be the oscillation startup state when the direct-current voltage has not reached the given threshold voltage, and can be determined to be the steady oscillation state when the direct-current voltage has reached the given threshold voltage. Therefore, the oscillation loop is switched from the first oscillation loop to the second oscillation loop on condition that the oscillation detector has detected that the direct-current voltage obtained by converting the current flowing toward the vibrator has reached the given threshold voltage.

In the driver device according to this embodiment, the driver device may cause the vibrator to produce the driving vibrations using the output from the comparator when the first oscillation loop including the vibrator and the comparator is formed, and may use the output from the comparator as a synchronous detection clock signal for generating the output signal when the second oscillation loop including the vibrator and the gain control amplifier is formed.

The gain in the oscillation loop can be set to be larger than unity without providing an additional circuit by utilizing the synchronous detection clock signal (synchronous detection reference signal) generation circuit for driving the vibrator. Moreover, since the synchronous detection clock signal is generated after the steady oscillation state has been achieved, synchronous detection for detecting the physical quantity can be performed.

In the driver device according to this embodiment, the polarity of the output from the gain control amplifier may be the same as the polarity of the output from the comparator.

This aspect makes it unnecessary to provide a circuit which reverses the polarity, whereby an increase in the circuit scale can be suppressed.

The driver device according to this embodiment may comprise:

an oscillation detector which detects a signal from the vibrator;

wherein, when the driver device is set in the first operation mode, the driver device may switch the oscillation loop from the first oscillation loop including the vibrator and the comparator to the second oscillation loop including the vibrator and the gain control amplifier based on a detection result of the oscillation detector.

The oscillation detector is generally used to control oscillations in the oscillation loop. The oscillation detector detects the oscillation state based on the oscillation detection signal (direct-current voltage) obtained by converting the current from the vibrator into a voltage. The switching element can be switch-controlled utilizing the detection result of the oscillation state, for example. Therefore, the synchronous detection process and oscillation startup can be accelerated without increasing the circuit scale.

In the driver device according to this embodiment, the driver device may switch the oscillation loop from the first oscillation loop including the vibrator and the comparator to the second oscillation loop including the vibrator and the gain control amplifier based on a detection result of the oscillation detector on condition that the oscillation detector has detected that a direct-current voltage obtained by converting current flowing toward the vibrator has reached a given threshold voltage.

The oscillation detector detects whether or not the direct-current voltage obtained by converting the current flowing toward the vibrator has reached a given threshold voltage. The oscillation state can be determined to be the oscillation startup state when the direct-current voltage has not reached the given threshold voltage, and can be determined to be the steady oscillation state when the direct-current voltage has reached the given threshold voltage. Therefore, the oscillation loop is switched from the first oscillation loop to the second oscillation loop on condition that the oscillation detector has detected that the direct-current voltage obtained by converting the current flowing toward the vibrator has reached the given threshold voltage.

The driver device according to this embodiment may comprise:

a gain control circuit which controls a gain of the gain control amplifier based on a voltage signal obtained by converting a current signal from the vibrator into a voltage signal;

wherein, when the driver device is set in the second operation mode, the driver device may disable an operation of the gain control circuit without disabling operations of the gain control amplifier and the comparator.

According to this embodiment, the second operation mode is achieved by disabling the gain control circuit (e.g. AGC circuit). Such a control can be easily realized. According to this aspect, when the driver device is set in the first operation mode, the signal in the oscillation loop is amplified using the comparator which generates the synchronous detection reference signal during oscillation startup, and the oscillation loop is switched when the steady oscillation state has been achieved. The oscillation amplitude in the oscillation loop is then controlled by the gain control amplifier. This enables the synchronous detection process and oscillation startup to be accelerated. When the driver device is set in the second operation mode, the oscillation state is maintained in the oscillation loop including the vibrator and the comparator, and the operation of the gain control circuit is suspended. Therefore, power consumption in the second operation mode can be reduced while accelerating oscillation startup when the second operation mode has been canceled.

In the driver device according to this embodiment, the driver device may cause the vibrator to produce the driving vibrations using the output from the comparator when the first oscillation loop including the vibrator and the comparator is formed, and may use the output from the comparator as a synchronous detection clock signal for generating the output signal when the second oscillation loop including the vibrator and the gain control amplifier is formed.

The gain in the oscillation loop can be set to be larger than unity without providing an additional circuit by utilizing the synchronous detection clock signal (synchronous detection reference signal) generation circuit for driving the vibrator. Moreover, since the synchronous detection clock signal is generated after the steady oscillation state has been achieved, synchronous detection for detecting the physical quantity can be performed.

In the driver device according to this embodiment, the polarity of the output from the gain control amplifier may be the same as the polarity of the output from the comparator.

According to this embodiment, it is unnecessary to provide a circuit which reverses the polarity, whereby an increase in the circuit scale can be suppressed.

According to another embodiment of the invention, there is provided a physical quantity measuring device for measuring a physical quantity corresponding to a detection signal output from a vibrator based on driving vibrations produced by the vibrator and the physical quantity to be measured, the physical quantity measuring device comprising:

a vibrator;

the above driver device which causes the vibrator to produce driving vibrations; and a detection device which detects an output signal corresponding to the physical quantity based on the detection signal, the detection device including a synchronous detector which synchronously detects the detection signal based on the output from the comparator.

According to this embodiment, a physical quantity measuring device can be provided which accelerates the synchronous detection process and oscillation startup without increasing the circuit scale and achieves a reduction in size and power consumption.

In the physical quantity measuring device according to this embodiment, the detection device may include a phase shifter which adjusts the phases of the output from the comparator and the detection signal.

According to this embodiment, the phase can be adjusted corresponding to a change in phase during a weak detection signal detection process. As a result, a highly accurate phase adjustment can be achieved while preventing an increase in circuit scale.

According to a further embodiment of the invention, there is provided an electronic instrument comprising the above physical quantity measuring device.

This contributes to reducing the size and the power consumption of an electronic instrument which performs a given process using the physical quantity measurement results.

According to a further embodiment of the invention, there is provided a physical quantity measuring device for measuring a physical quantity corresponding to a detection signal output from a vibrator based on driving vibrations produced by the vibrator and the physical quantity to be measured, the physical quantity measuring device comprising:

a vibrator;

the above driver device which causes the vibrator to produce driving vibrations; and a detection device which detects an output signal corresponding to the physical quantity based on the detection signal, the detection device including a synchronous detector which synchronously detects the detection signal based on the output from the comparator.

According to this embodiment, a physical quantity measuring device can be provided which can reduce the oscillation startup time without increasing the circuit scale when recovering from the sleep mode and when causing vibrations.

In the physical quantity measuring device according to this embodiment, the detection device may include a phase shifter which adjusts phases of the output from the comparator and the detection signal.

According to this embodiment, the phase can be adjusted corresponding to a change in phase during a weak detection signal detection process. As a result, a highly accurate phase adjustment can be achieved while preventing an increase in circuit scale.

According to a further embodiment of the invention, there is provided an electronic instrument comprising the above physical quantity measuring device.

This embodiment contributes to reducing the size and the power consumption of an electronic instrument which performs a given process using the physical quantity measurement results. Moreover, an electronic instrument can be provided which includes a driver device which can reduce the oscillation startup time without increasing the circuit scale when recovering from the sleep mode and when causing vibrations.

In the driver device according to this embodiment, the vibrator may be a capacitive-coupling vibrator; and the gain control amplifier may cause the vibrator to produce the driving vibrations by applying a rectangular-wave driving signal to the vibrator.

The rectangular-wave drive method has an advantage in that the variation in the driving signal is small. Moreover, since the voltage amplitude is easily controlled, the circuit configuration can be simplified, whereby the circuit scale can be reduced.

When using the capacitive-coupling vibrator (vibrator in which a direct-current blocking capacitor lies in the signal path in the internal equivalent circuit), an arbitrary potential may be used as the direct-current potential of the oscillation loop, whereby the degrees of freedom relating to the circuit configuration are increased. A piezoelectric element can be given as an example of the capacitive-coupling vibrator (capacitive vibrator).

The embodiments of the invention are described below in detail with reference to the drawings.

Note that the embodiments described below do not in any way limit the scope of the invention laid out in the claims. Note that all elements of the embodiments described below should not necessarily be taken as essential requirements for the invention.

First Embodiment

FIG. 1 is a block diagram showing a configuration example of an oscillation driver circuit (driver device) according to this embodiment. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

(Oscillation Conditions During Oscillation Startup and During Stable Oscillations)

An oscillation driver circuit 200 drives a physical quantity transducer 200 by means of an oscillation loop. In the oscillation driver circuit 200 according to this embodiment, the loop gain is set to be larger than unity during oscillation startup in order to enable a high-speed startup. Specifically, the oscillation conditions during oscillation startup are satisfied when the loop gain is larger than unity and the phase in the loop is 360°×n (n is an integer). The oscillation conditions during stable oscillations are satisfied when the loop gain is unity and the phase in the loop is 360°×n (n is an integer).

(Power Supply Voltage of Oscillation Driver Circuit)

The oscillation driver circuit 200 shown in FIG. 1 operates between a power supply voltage VDD (high-potential-side power supply) and a power supply voltage GND (ground potential: low-potential-side power supply). Note that an analog ground (AGND: the analog ground AGND is a reference potential of the circuit and does not necessarily coincide with the power supply voltage GND) may be used instead of the power supply voltage GND (ground potential). Specifically, the power supply potential which may be used differs depending on the type of the physical quantity transducer (vibrator) 400.

When the physical quantity transducer 400 is a capacitive-coupling transducer (configuration in which a direct-current blocking capacitor lies in the signal path in the internal equivalent circuit), direct current is cut off. Therefore, with regard to the direct current level (bias point) of the oscillation loop, it suffices that the voltage amplitude of the driving signal of the oscillation loop be adjusted regardless of the circuit operation. Therefore, an arbitrary potential (including GND and AGND) may be basically used as the low-potential-side power supply, for example.

When the physical quantity transducer 400 is a variable-resistance transducer, it is necessary to set the bias voltage of the oscillation loop at a desired level. Therefore, an analog ground (AGND: reference voltage in the circuit) at a desired level is generally used.

The power supply method is classified into a single power supply method (method using only positive power supply) and a dual power supply method (method using positive and negative power supplies). The latter method is used particularly when accuracy is important.

The invention may employ either of the above power supply methods. In FIG. 1 (the same applies to other drawings), the physical quantity transducer 400 is a capacitive-coupling transducer. The following description is given on the assumption that a single power supply method is employed and the oscillation driver circuit 200 operates between the power supply voltage VDD (e.g. 5 V) and the power supply voltage GND (ground potential).

(Driving by Rectangular Wave)

In one embodiment of the invention, a method may be employed in which the vibrator (physical quantity transducer) is driven by a rectangular wave. This method utilizes a phenomenon in which unnecessary harmonics are reduced by the frequency filtering effect of the physical quantity transducer, even when driving the physical quantity transducer by a rectangular wave at a specific frequency (including third-order and fifth-order harmonic components), whereby a driving signal at a desired frequency (resonance frequency) is obtained. Note that the drive method is not limited thereto. A drive method using an analog waveform (e.g. sine wave) may also be used.

(Switching of Oscillation Loop)

In the invention, a first oscillation loop including a comparator 50 which generates a synchronous detection clock signal (synchronous detection reference signal) and a second oscillation loop including a gain control amplifier 20 are selectively used. The loop gain of the first oscillation loop is set to be larger than unity.

The oscillation amplitude necessary for constant oscillations can be achieved quickly during oscillation startup using the first oscillation loop, whereby the startup time can be significantly reduced.

When a steady oscillation state in a normal operation mode has occurred, the oscillation loop is switched from the first oscillation loop to the second oscillation loop. The oscillation amplitude in the oscillation loop is then stably controlled by the gain control amplifier 20. The oscillation amplitude is basically controlled so that the loop gain becomes unity by negative feedback control.

The steady oscillation state can be more promptly achieved by setting the gain in the oscillation loop to be larger than unity utilizing the comparator.

The output voltage of the comparator generally swings to a maximum between the power supply voltages (including a voltage which may be considered to be the power supply voltage). The comparator serves as a synchronous detection reference clock signal generation circuit.

The gain in the oscillation loop can be efficiently set to be larger than unity without providing an additional circuit by utilizing the output from the comparator for driving the vibrator.

(Configuration and Operation of Oscillation Driver Device)

FIG. 1 is a block diagram showing a configuration example of an oscillation driver circuit (driver device) according to this embodiment. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals outside the oscillation driver circuit 10. An excitation means 14 is attached to the vibrator 12. The excitation means 14 is connected with the oscillation driver circuit 10 to form an oscillation loop. An oscillation starts in a state in which the gain of a driver in the oscillation driver circuit 10 is large (i.e., the gain is larger than unity). In this state, only noise is input to the driver. The noise includes wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output by the frequency filtering effect of the vibrator 12, and input to the driver. The above operation is repeated in the oscillation loop so that the percentage of the signal at the desired natural resonance frequency increases, whereby the amplitude of the signal input to the driver increases.

In the steady oscillation state, the output current from the vibrator 12 is converted into a voltage value using a current-voltage converter 30, and the oscillation amplitude in the oscillation loop is controlled using an auto gain control (AGC) circuit 40 based on the voltage value. This causes the gain (loop gain) while the signal goes round the oscillation loop to become unity, and the vibrator 12 stably oscillates in this state.

Stable oscillations of the vibrator are indispensable for the measurement of the physical quantity. Specifically, if the amplitude of the driving signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, the oscillation driver circuit 10 uses the comparator 50 as the driver during oscillation startup, and uses the gain control amplifier (hereinafter abbreviated as GCA) 20 as the driver in the steady oscillation state.

In this embodiment, the GCA 20 and the comparator 50 are provided in parallel in the oscillation driver circuit 10.

Figure 4:
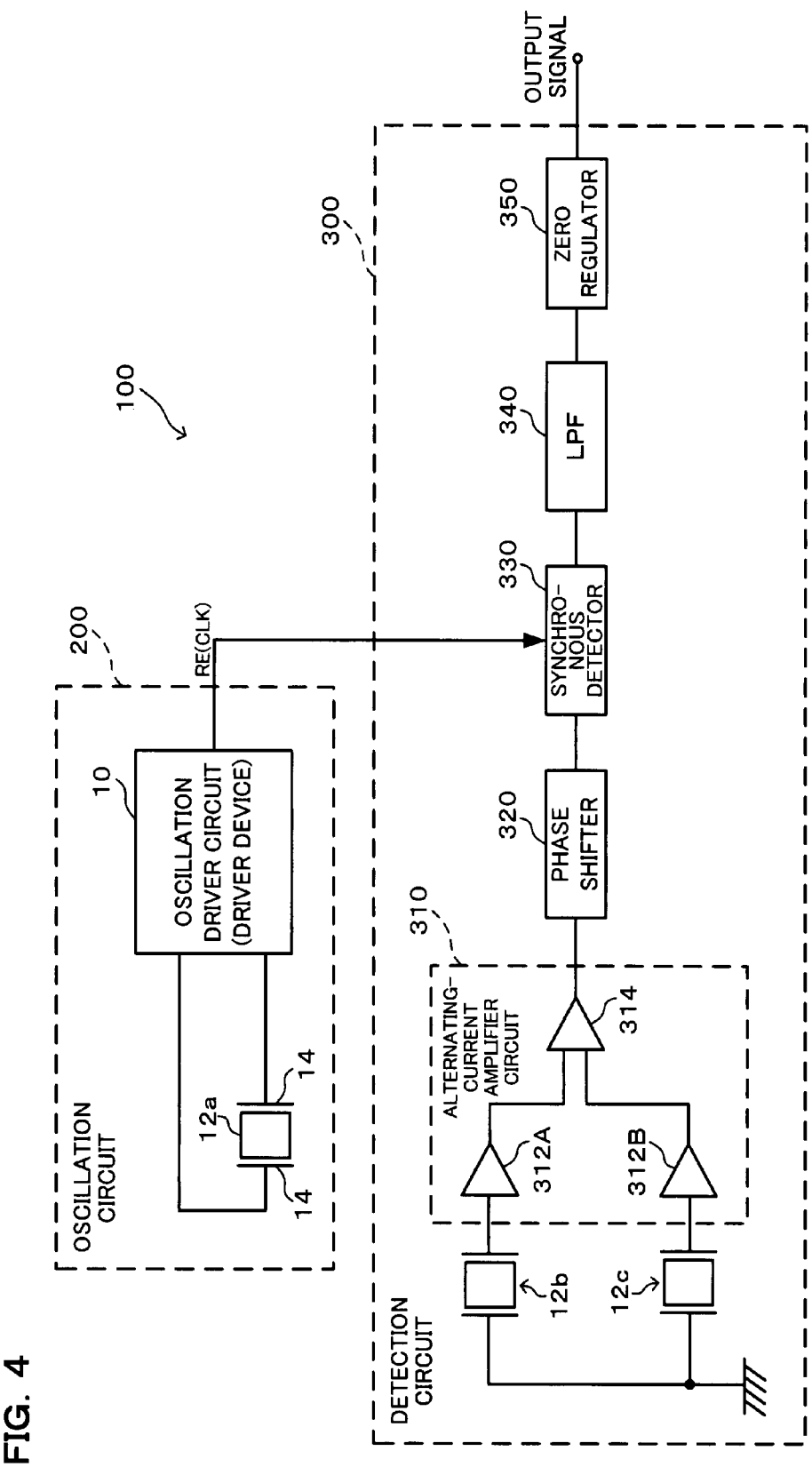
FIG. 4 is a block diagram showing a configuration example of a vibrating gyrosensor according to the first embodiment.

The comparator 50 generates the synchronous detection clock signal (RE(CLK)) as the synchronous detection reference signal, and supplies the synchronous detection clock signal to a synchronous detector 330 provided in a detection circuit 30 (see FIG. 4).

The oscillation driver circuit 10 includes a first switching element SW1 inserted between the output of the GCA 20 and the second connection terminal TM2. The first switching element SW1 is ON/OFF-controlled using a switch control signal SWCTL. The oscillation driver circuit 10 includes a second switching element SW2 inserted between the output of the comparator 50 and the second connection terminal TM2. The second switching element SW2 is ON/OFF-controlled using a switch control signal SWCTL#. The switch control signal SWCTL# is an inversion signal of the switch control signal SWCTL.

The oscillation driver circuit 10 includes a third switching element SW3 for outputting the output from the comparator 50 as the synchronous detection clock signal (synchronous detection reference signal). The third switching element SW3 is ON/OFF-controlled using a switch control signal SWCTL1. The switch control signal SWCTL1 is an inversion signal of the switch control signal SWCTL#.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and generates a switch control signal SWCTL corresponding to the detection result. For example, the oscillation detector 44 compares the voltage value converted by the full-wave rectifier 42 with a given reference voltage value, and generates the switch control signal SWCTL based on the comparison result. The integrator 46 generates a control signal VCTL for the GCA 20 to control oscillations in the oscillation loop based on the integration result of the voltage value converted by the full-wave rectifier 42. For example, the integrator 46 integrates the voltage value converted by the full-wave rectifier 42 to determine the level of the direct-current component, compares the determined level with a given reference signal level, and generates the control signal VCTL based on the comparison result. For example, the high-potential-side power supply voltage of the circuit (output circuit) in the output stage (final stage) of the GCA 20 is controlled based on the control signal VCTL.

In this embodiment, the oscillation loop including the vibrator 12 and the GCA 20 and the oscillation loop including the vibrator 12 and the comparator 50 are switched by controlling the first and second switching elements SW1 and SW2, as described above.

The AGC circuit 40 performs switch control of the first and second switching elements SW1 and SW2 and oscillation amplitude control of the GCA 20.

Figure 2:
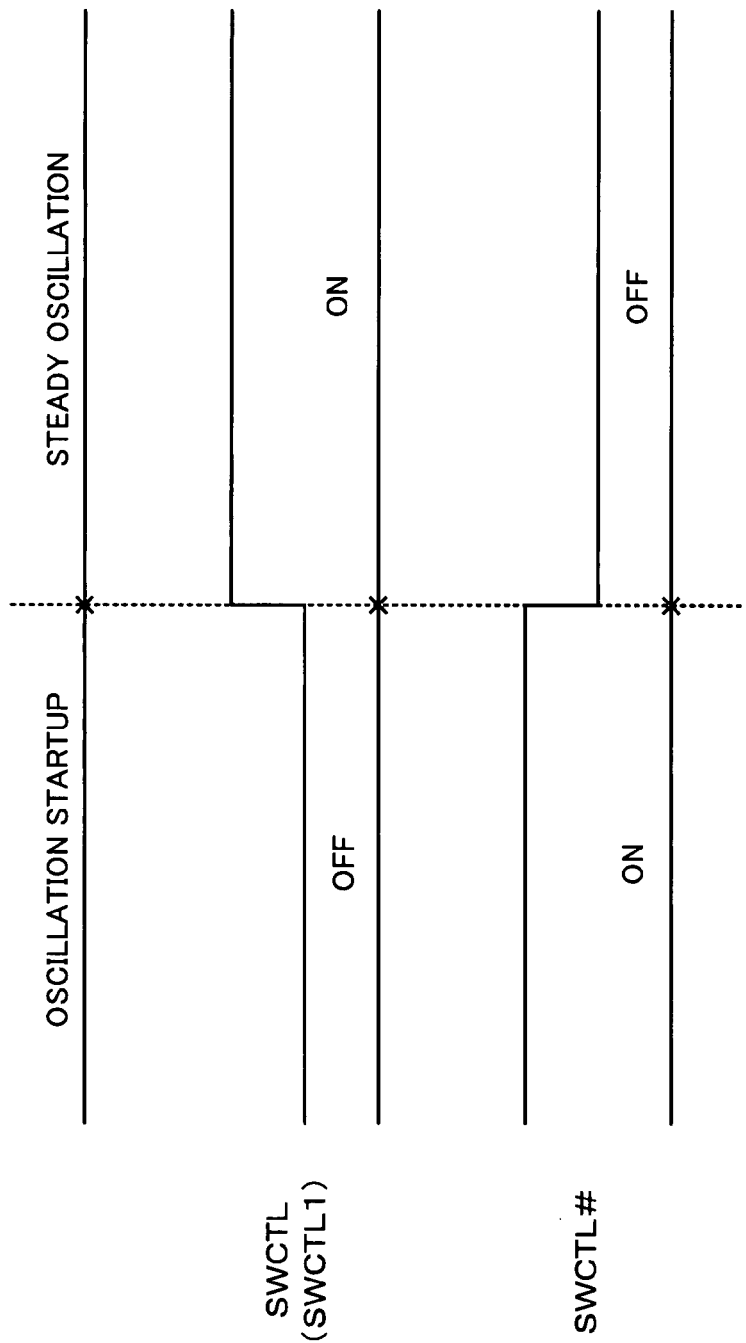
FIG. 2 is a timing diagram showing an example of a switch control signal shown in FIG. 1.

FIG. 2 is a timing waveform diagram of the switch control signals SWCTL and SWCTL.

In the oscillation startup state such as immediately after supplying power, the oscillation detector 44 of the AGC circuit 40 detects that the voltage value obtained by converting the current signal from the vibrator 12 is lower than the given reference voltage value, and the oscillation detector 44 generates the switch control signal SWCTL set at the L level. This causes the first switching element SW1 and the switching element SW3 to be turned OFF and causes the second switching element SW2 to be turned ON. In this case, when the level of the input signal of the comparator 50 has exceeded a given threshold value, the comparator 50 amplifies the input signal by a very large gain to set the gain in the oscillation loop to be larger than unity. As a result, the vibrator 12 is caused to produce driving vibrations during the oscillation startup state so that the gain in the oscillation loop including the vibrator 12 and the comparator 50 is larger than unity and the phase in the oscillation loop is 360×n (n is an integer).

When the oscillation detector 44 has detected that the voltage value obtained by converting the current signal from the vibrator 12 is higher than the given reference voltage value, the oscillation detector 44 generates the switch control signal SWCTL set at the H level. This causes the first switching element SW1 and the switching element SW3 to be turned ON and causes the second switching element SW2 to be turned OFF. In this case, the oscillation amplitude in the oscillation loop is controlled by the GCA 20 based on the control signal VCTL from the AGC circuit 40 so that the gain in the oscillation loop becomes unity. As a result, the oscillation startup state is terminated and transitions to the steady oscillation state. In the steady oscillation state, the vibrator 12 is caused to produce driving vibrations so that the gain in the oscillation loop including the vibrator 12 and the GCA 20 is unity and the phase in the oscillation loop is 360×n.

In this embodiment, the oscillation loop can be switched from the oscillation loop formed by the vibrator 12 and the comparator 50 to the oscillation loop formed by the vibrator 12 and the GCA 20 based on the detection result of the oscillation detector 44, as described above. Specifically, the above switch control is performed on condition that the oscillation detector 44 has detected that the direct-current voltage obtained by converting the current flowing toward the vibrator 12 has reached the given threshold voltage. This enables the switching element to be switch-controlled utilizing the signal detection result from the vibrator 12 generally used for oscillation control of the oscillation loop, whereby a high-speed oscillation startup can be realized without increasing the circuit scale to a large extent.

In this embodiment, the output from the comparator 50 is output as the synchronous detection clock signal through the third switching element SW3 in the steady oscillation state. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable to make the gain of the comparator 50 as large as possible. This makes it possible to increase the loop gain in the oscillation loop formed during the oscillation startup state, whereby the oscillation startup time can be reduced. Moreover, the accuracy of the synchronous detection clock signal output during the steady oscillation state can be increased.

It is preferable that the polarity (inversion and noninversion) of the operational amplifier forming the GCA 20 be the same as the polarity of the operational amplifier forming the comparator 50. This makes it unnecessary to provide a circuit which reverses polarity, even if the oscillation loop is switched using the first and second switching elements SW1 and SW2, whereby an increase in the circuit scale can be suppressed.

Figure 3:
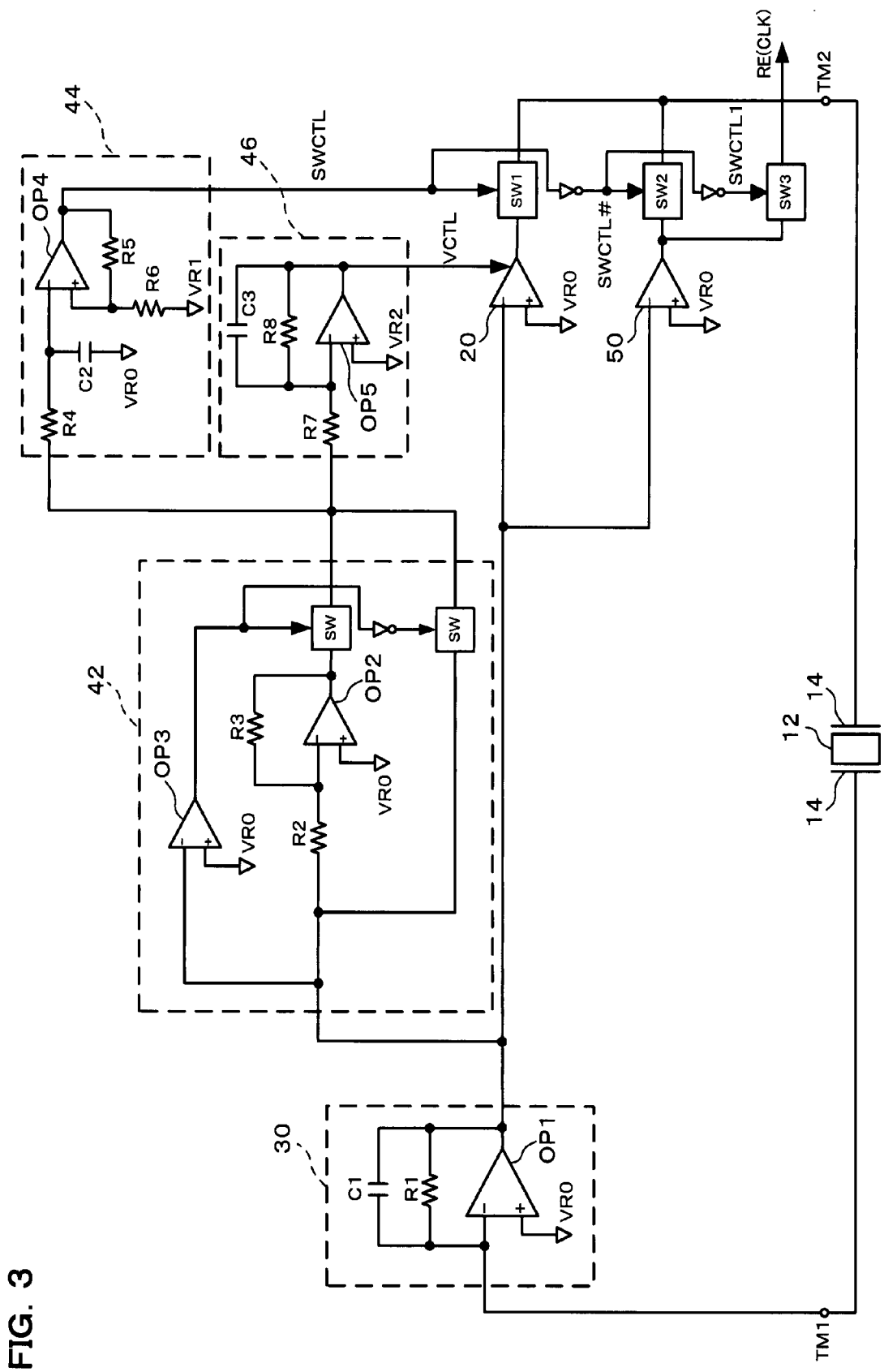
FIG. 3 is a view showing a detailed circuit example of the oscillation driver circuit shown in FIG. 1.

FIG. 3 is a circuit diagram showing a detailed configuration example of the oscillation driver circuit 10 shown in FIG. 1.

In FIG. 3, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the switch control signal SWCTL.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage V R2 is supplied to the non-inverting input terminal of the operational amplifier OP5. The integrator 46 functions as an LPF by the capacitor C3 and the resistor R8. The cut-off frequency is $1/(2\pi \times C3 \times R8)$. The output signal from the operational amplifier OP5 is supplied to the GCA 20 as the control signal VCTL.

The current which flows toward the vibrator 12 in the oscillation startup state is indicated by Id, and the current which flows toward the vibrator 12 in the steady oscillation state is indicated by Id'. The reference voltage VR2 is expressed by the following equation taking into account the smoothing by the current-voltage converter 30, $$VR2=(Id \times R1 \times 2/\pi)+VR0 \quad (1)$$

where, R1 indicates the resistance value of the feedback resistor of the current-voltage converter 30. Likewise, the reference voltage VR1 is expressed by the following equation.

$$VR1=(Id' \times R1 \times 2/\pi)+VR0 \quad (2)$$

Since Id'<Id, the reference voltage VR2 is higher than the reference voltage VR1. It is preferable that the reference voltages VR1 and VR2 have the following relationship with the reference voltage VR0.

$$VR0<VR1<VR2 \quad (3)$$

(Rectangular Wave Drive, Sine Wave Drive, and Capacitive-Coupling Vibrator)

The driver device according to this embodiment shown in FIG. 1 may employ rectangular wave drive and sine wave drive.

Figure 11A:
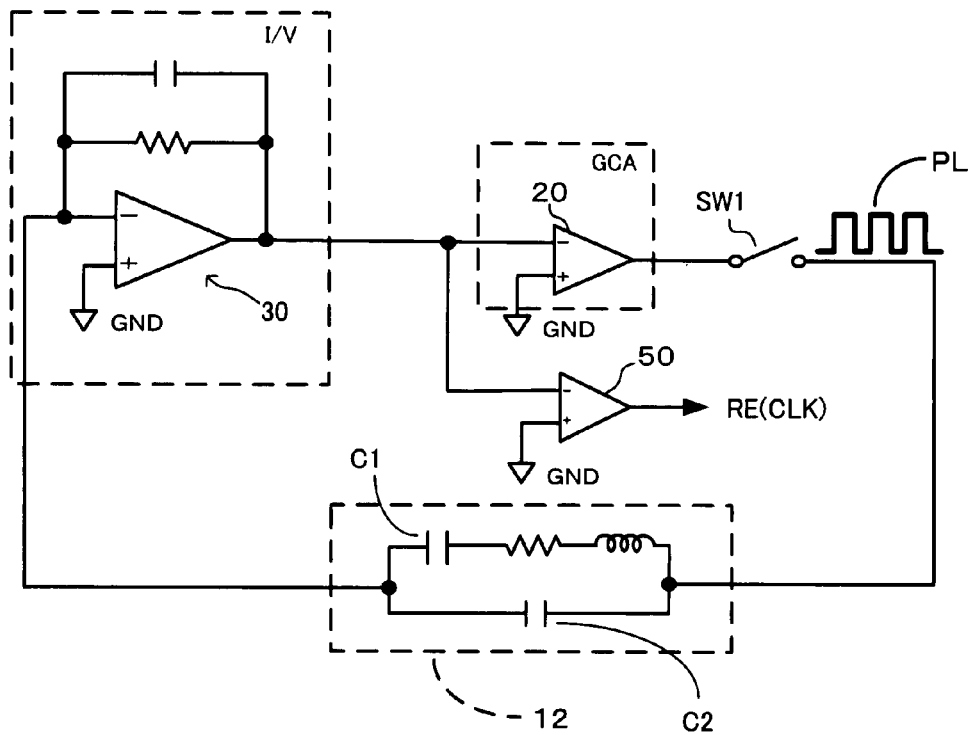
FIGS. 11A and 11B are circuit diagrams illustrative of rectangular wave drive, sine wave drive, and a capacitive-coupling vibrator.

FIG. 11A shows the major portion of the driver device which performs rectangular wave drive. As shown in FIG. 11A, the vibrator 12 is driven by a rectangular-wave driving signal (PL). The gain of the oscillation loop can be easily controlled by adjusting the high-level voltage or the low-level voltage of the driving signal (PL).

The rectangular-wave drive method has an advantage in that the variation in the driving signal (PL) is small. Moreover, since the voltage amplitude of the driving signal is easily controlled, the circuit configuration can be simplified, whereby the circuit scale can be reduced.

Figure 11B:
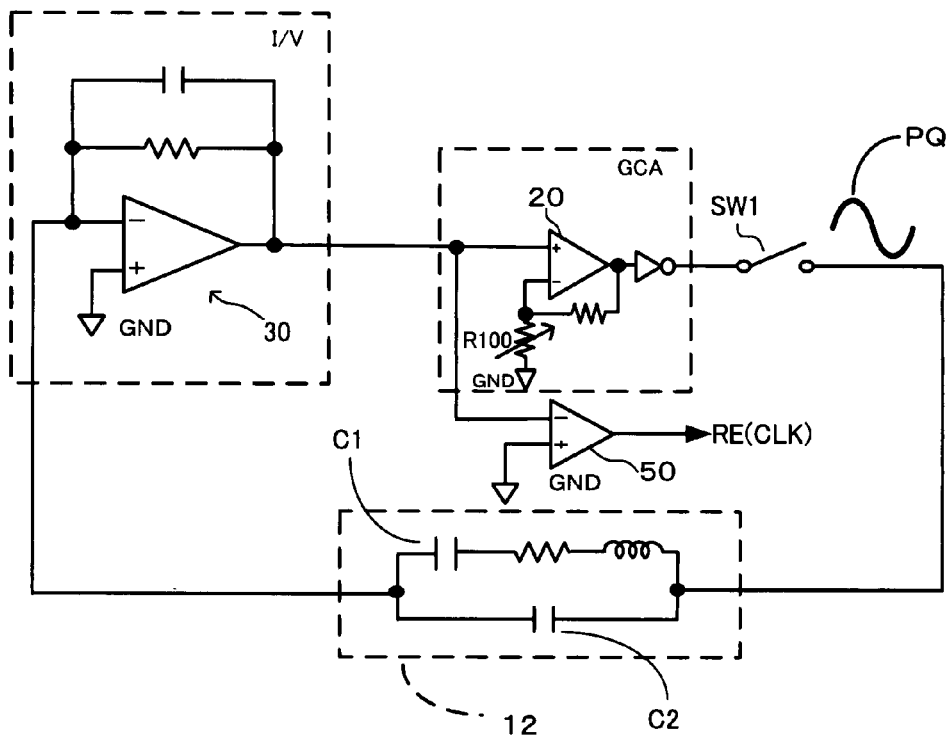

FIG. 11B shows the major portion of the driver device which performs sine wave drive. As shown in FIG. 11B, the vibrator 12 is driven by a sine-wave driving signal (PQ). The gain control amplifier (GCA) 20 controls the gain in the oscillation loop by variably controlling the resistance value of a variable resistor 100.

In FIGS. 11A and 11B, a capacitive-coupling vibrator is used as the vibrator 14. Note that the vibrator 14 is not limited thereto. Various vibrators such as a variable-resistance vibrator may also be used.

The capacitive-coupling vibrator (capacitive vibrator) is a vibrator in which a direct-current blocking capacitor (C1 and C2 in FIG. 11) lies in the signal path in the internal equivalent circuit. A piezoelectric element can be given as an example of the capacitive-coupling vibrator (capacitive vibrator).

When using the capacitive-coupling vibrator, an arbitrary potential may be used as the direct-current potential of the oscillation loop. Therefore, the degrees of freedom relating to the circuit configuration are increased.

(Configuration and Operation of Vibrating Gyrosensor)

FIG. 4 is a block diagram showing a configuration example of a vibrating gyrosensor to which the oscillation driver circuit 10 according to this embodiment is applied.

In FIG. 4, the same sections as in FIG. 1 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12a of the vibrator 12 to oscillate.

During oscillation startup, the output from the comparator 50 is input to the oscillation driver circuit 10 as noise. The noise is subjected to frequency selection while passing through the driving vibration section 12a of the vibrator 12. The signal which has passed through the driving vibration section 12a is partially removed, input to the full-wave rectifier 42, and converted into an amplitude. The signal with the amplitude is input to the oscillation detector 44 to generate the switch control signal SWCTL. Since the amplitude of the signal subjected to frequency selection while passing through the vibrator 12a is small during oscillation startup, the oscillation detector 44 generates the switch control signal SWCTL set at the L level.

The amplitude of the signal subjected to frequency selection while passing through the vibrator 12a increases immediately after oscillation startup, whereby the oscillation detector 44 generates the switch control signal SWCTL set at the H level. This causes the oscillation loop to be switched so that the amplitude of the signal subjected to frequency selection while passing through the vibrator 12a is controlled by the GCA 20. When most of the noise is cut off by the driving vibration section 12a and the output from the full-wave rectifier 42 is relatively small, the gain of the GCA 20 is increased so that the loop gain around the oscillation loop becomes unity. Since the output from the full-wave rectifier 42 increases with the passage of time, the gain of the GCA 20 is reduced so that the loop gain becomes unity.

When the oscillation state of the driving signal has been stabilized, signals from driving detection sections 12b and 12c of the vibrator 12 start to be detected. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed up by an adder 314.

The output from the adder 314 is caused to pass through a phase shifter 320 to obtain a phase shift signal. The phase of the phase shift signal differs from the phase of the synchronous detection clock signal which is the output from the comparator 50 of the oscillation driver circuit 10 by a specific angle such as 90°. The phase shift signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 4 is preferably provided in electronic instruments such as a video camera, a digital camera, a car navigation system, an aircraft, and a robot.

The invention is not limited to the vibrator 12 according to this embodiment. As examples of the material for the vibrator 12, constant modulus alloys such as elinvar and ferroelectric single crystals (piezoelectric single crystals) can be given. As examples of such single crystals, a crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to the angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator producing driving vibrations. As such a physical quantity, acceleration and angular acceleration are particularly preferred in addition to the angular velocity applied to the vibrator. As the detection device, an inertial sensor is preferred.

Second Embodiment

A driver device according to this embodiment has a first operation mode (normal operation mode) and a second operation mode (low power consumption mode: sleep mode). A first oscillation loop including a vibrator and a comparator which generates a synchronization clock signal is used in the second operation mode.

A high-speed transition to the steady oscillation state in the normal operation mode can be achieved when the low power consumption mode is canceled by maintaining the gain in the oscillation loop at a value larger than unity in the low power consumption mode (sleep mode).

The output voltage of the comparator generally swings to a maximum between power supply voltages (including a voltage which may be considered to be the power supply voltage). The comparator serves as a synchronous detection reference clock signal generation circuit. The gain in the oscillation loop can be efficiently set to be larger than unity without providing an additional circuit in the same manner as in the first embodiment by utilizing the output from the comparator for driving the vibrator.

The second embodiment is described below in detail with reference to FIGS. 5 to 10.

(Configuration and Operation of Driver Device)

Figure 5:
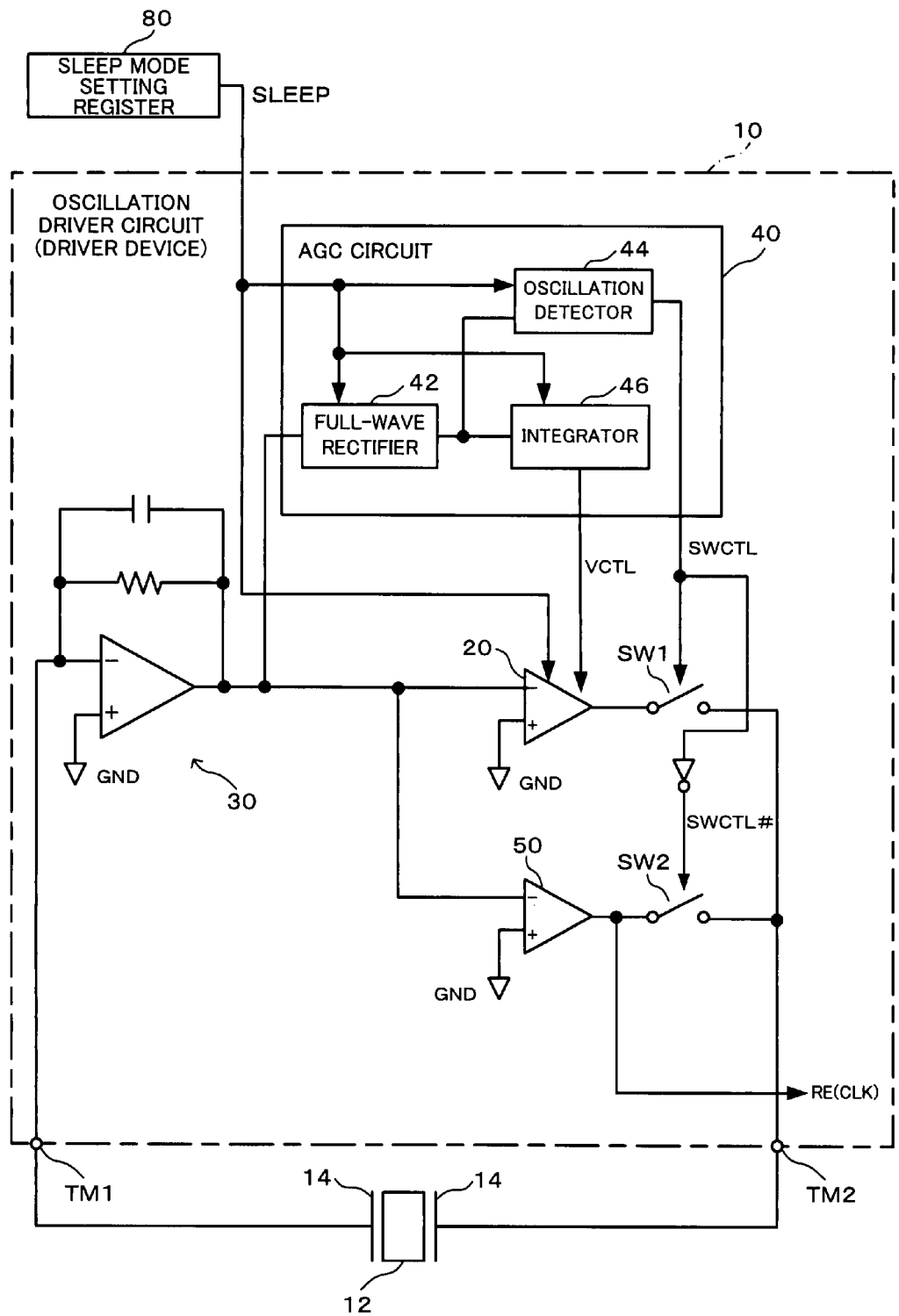
FIG. 5 is a circuit block diagram showing a configuration example of an oscillation driver circuit according to a second embodiment.

FIG. 5 is a block diagram showing a configuration example of an oscillation driver circuit (driver device) according to this embodiment. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals outside the oscillation driver circuit 10. An excitation means 14 is attached to the vibrator 12. The excitation means 14 is connected with the oscillation driver circuit 10 to form an oscillation loop. An oscillation starts in a state in which the gain of a driver in the oscillation driver circuit 10 is large (i.e., the gain is larger than unity). In this state, only noise is input to the driver. The noise includes wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output by the frequency filtering effect of the vibrator 12, and input to the driver. The above operation is repeated in the oscillation loop so that the percentage of the signal at the desired natural resonance frequency increases, whereby the amplitude of the signal input to the driver increases.

In the steady oscillation state, the output current from the vibrator 12 is converted into a voltage value using a current-voltage converter 30, and the oscillation amplitude in the oscillation loop is controlled using an auto gain control (AGC) circuit (gain control circuit in a broad sense) 40 based on the voltage value. This causes the gain (loop gain) while the signal goes round the oscillation loop to become unity, and the vibrator 12 stably oscillates in this state.

Stable oscillations of the vibrator are indispensable for the measurement of the physical quantity. Specifically, if the amplitude of the driving signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, the oscillation driver circuit 10 uses the comparator 50 as the driver during oscillation startup, and uses the gain control amplifier (hereinafter abbreviated as GCA) 20 as the driver in the steady oscillation state.

In this embodiment, the GCA 20 and the comparator 50 are provided in parallel in the oscillation driver circuit 10. The oscillation driver circuit 10 includes a first switching element SW1 inserted between the output of the GCA 20 and the second connection terminal TM2. The first switching element SW1 is ON/OFF-controlled using a switch control signal SWCTL. The oscillation driver circuit 10 includes a second switching element SW2 inserted between the output of the comparator 50 and the second connection terminal TM2. The second switching element SW2 is ON/OFF-controlled using a switch control signal SWCTL#. The switch control signal SWCTL# is an inversion signal of the switch control signal SWCTL.

The oscillation driver circuit 10 can output the output from the comparator 50 as a synchronous detection clock signal (synchronous detection reference signal).

The oscillation driver circuit 10 has a normal mode (first operation mode in a broad sense) and a sleep mode (second operation mode in a broad sense) as operation modes in order to reduce power consumption. A sleep mode setting register 80 is provided inside or outside the oscillation driver circuit 10. A control circuit (not shown) which controls the oscillation driver circuit 10 sets control data in the sleep mode setting register 80. The oscillation driver circuit 10 operates in the operation mode corresponding to the control data set in the sleep mode setting register 80. For example, when "0" is set in the sleep mode setting register 80, the oscillation driver circuit 10 operates in the normal mode. For example, when "1" is set in the sleep mode setting register 80, the oscillation driver circuit 10 operates in the sleep mode.

A sleep control signal SLEEP corresponding to the control data set in the sleep mode setting register 80 is supplied to the GCA 20 and the AGC circuit 40. When the oscillation driver circuit 10 operates in the sleep mode, the operations of the GCA 20 and the AGC circuit 40 are suspended. In this embodiment, the current-voltage converter 30 and the comparator 50 operate without being disabled (enabled state is maintained) when the oscillation driver circuit 10 operates in the sleep mode.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and generates a switch control signal SWCTL corresponding to the detection result. For example, the oscillation detector 44 compares the voltage value converted by the full-wave rectifier 42 with a given reference voltage value, and generates the switch control signal SWCTL based on the comparison result. The integrator 46 generates a control signal VCTL for the GCA 20 to control oscillations in the oscillation loop based on the integration result of the voltage value converted by the full-wave rectifier 42. For example, the integrator 46 integrates the voltage value converted by the full-wave rectifier 42 to determine the level of the direct-current component, compares the determined level with a given reference signal level, and generates the control signal VCTL based on the comparison result. For example, the high-potential-side power supply voltage of the circuit (output circuit) in the output stage (final stage) of the GCA 20 is controlled based on the control signal VCTL.

Specifically, the sleep control signal SLEEP is supplied to the full-wave rectifier 42, the oscillation detector 44, and the integrator 46. The operations of the full-wave rectifier 42, the oscillation detector 44, and the integrator 46 are suspended when the sleep mode is designated by the sleep control signal SLEEP. The full-wave rectifier 42, the oscillation detector 44, and the integrator 46 operate when the normal mode is designated by the sleep control signal SLEEP.

In this embodiment, the oscillation loop including the vibrator 12 and the GCA 20 and the oscillation loop including the vibrator 12 and the comparator 50 are switched by controlling the first and second switching elements SW1 and SW2 when the normal mode is set in the sleep mode setting register 80. In this embodiment, oscillations continue in the oscillation loop including the vibrator 12 and the comparator 50 when the sleep mode is set in the sleep mode setting register 80.

The AGC circuit 40 performs switch control of the first and second switching elements SW1 and SW2 and oscillation amplitude control of the GCA 20.

Figure 6A:
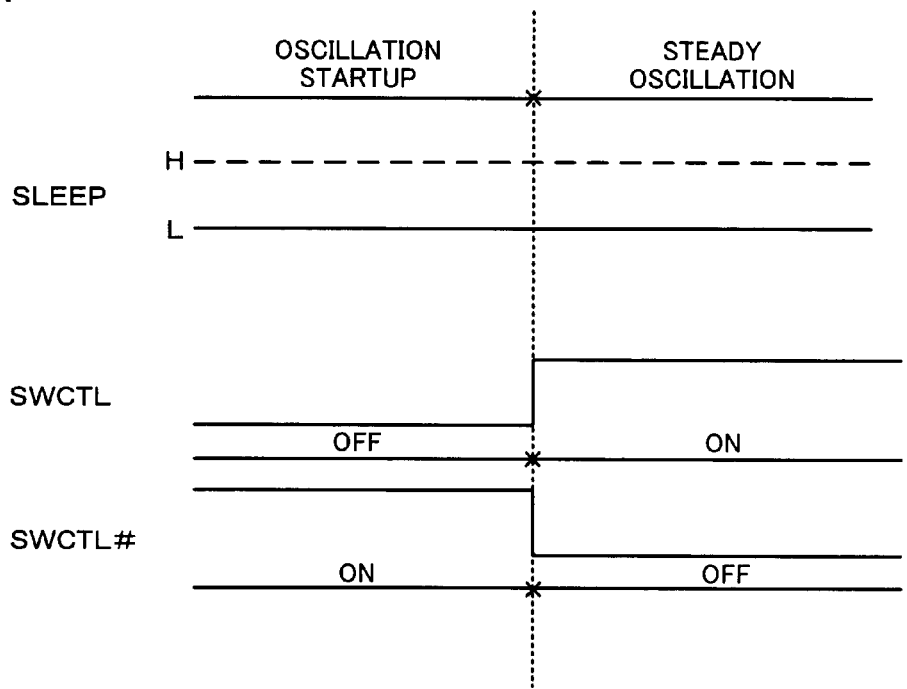
FIGS. 6A and 6B are timing waveform diagrams showing an example of a sleep control signal and switch control signals shown in FIG. 5.
Figure 6B:
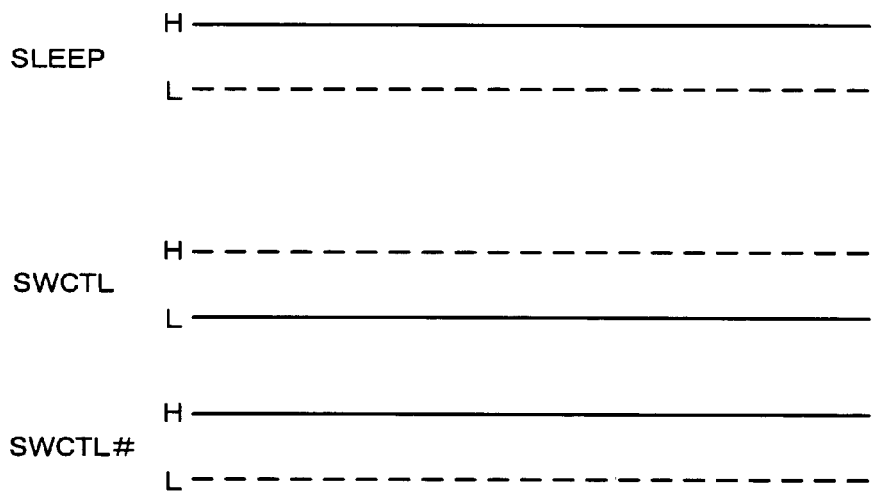

FIGS. 6A and 6B are timing waveform diagrams of the sleep control signal SLEEP and the switch control signals SWCTL and SWCTL#.

FIG. 6A is a timing waveform diagram in the normal mode, and FIG. 6B is a timing waveform diagram in the sleep mode.

In FIG. 6A, the oscillation driver circuit 10 operates in the normal mode when the sleep control signal SLEEP is set at the L level. In the oscillation startup state such as immediately after supplying power, the oscillation detector 44 of the AGC circuit 40 detects that the voltage value obtained by converting the current signal from the vibrator 12 is lower than the given reference voltage value, and the oscillation detector 44 generates the switch control signal SWCTL set at the L level. This causes the first switching element SW1 to be turned OFF and causes the second switching element SW2 to be turned ON. In this case, when the level of the input signal of the comparator 50 has exceeded a given threshold value, the comparator 50 amplifies the input signal by a very large gain to set the gain in the oscillation loop to be larger than unity. As a result, the vibrator 12 is caused to produce driving vibrations during the oscillation startup state so that the gain in the oscillation loop including the vibrator 12 and the comparator 50 is larger than unity and the phase in the oscillation loop is 360×n (n is an integer).

When the oscillation detector 44 has detected that the voltage value obtained by converting the current signal from the vibrator 12 is higher than the given reference voltage value, the oscillation detector 44 generates the switch control signal SWCTL set at the H level. This causes the first switching element SW1 to be turned ON and causes the second switching element SW2 to be turned OFF. In this case, the oscillation amplitude in the oscillation loop is controlled by the GCA 20 based on the control signal VCTL from the AGC circuit 40 so that the gain in the oscillation loop becomes unity. As a result, the oscillation startup state is terminated and transitions to the steady oscillation state. In the steady oscillation state, the vibrator 12 is caused to produce driving vibrations so that the gain in the oscillation loop including the vibrator 12 and the GCA 20 is unity and the phase in the oscillation loop is 360×n.

In this embodiment, the oscillation loop can be switched from the oscillation loop formed by the vibrator 12 and the comparator 50 to the oscillation loop formed by the vibrator 12 and the GCA 20 based on the detection result of the oscillation detector 44, as described above. Specifically, the above switch control is performed on condition that the oscillation detector 44 has detected that the direct-current voltage obtained by converting the current flowing toward the vibrator 12 has reached the given threshold voltage. This enables the switching element to be switch-controlled utilizing the signal detection result from the vibrator 12 generally used for oscillation control of the oscillation loop, whereby a high-speed oscillation startup can be realized without increasing the circuit scale to a large extent.

In FIG. 6B, the oscillation driver circuit 10 operates in the sleep mode when the sleep control signal SLEEP is set at the H level. In this case, the oscillation detector 44 generates the switch control signal SWCTL set at the L level irrespective of whether the oscillation driver circuit 10 is in the oscillation startup state such as immediately after supplying power or the steady oscillation state. This causes the first switching element SW1 to be turned OFF and causes the second switching element SW2 to be turned ON. Specifically, the oscillation driver circuit 10 is set in the same state as the oscillation startup state in the normal mode shown in FIG. 6A. In this case, when the level of the input signal of the comparator 50 has exceeded a given threshold value, the comparator 50 amplifies the input signal by a very large gain to set the gain in the oscillation loop to be larger than unity, as described above. As a result, the vibrator 12 is caused to produce driving vibrations during the oscillation startup state so that the gain in the oscillation loop including the vibrator 12 and the comparator 50 is larger than unity and the phase in the oscillation loop is 360× (n is an integer). This makes it possible to suspend the operation of the AGC circuit 40 in the sleep mode to reduce power consumption. In the sleep mode, the oscillation state continues in the oscillation loop used during the oscillation startup state in the normal mode. Therefore, a high-speed oscillation startup can be achieved when the operation mode transitions from the sleep mode to the normal mode. Therefore, a driver device can be provided which can reduce the oscillation startup time without increasing the circuit scale when the driver device can operate in the sleep mode.

As described above, when the oscillation driver circuit 10 is set in the normal mode, the oscillation driver circuit 10 sets the gain in the oscillation loop formed by the vibrator 12 and the comparator 50 to be larger than unity using the output from the comparator 50, and causes the vibrator 12 to produce driving vibrations by controlling the oscillation amplitude in the oscillation loop formed by the vibrator 12 and the GCA 20. When the oscillation driver circuit 10 is set in the sleep mode, the oscillation driver circuit 10 causes the vibrator 12 to produce driving vibrations in the oscillation loop formed by the vibrator 12 and the comparator 50.

When the oscillation driver circuit 10 includes the AGC circuit 40 which controls the gain of the GCA 20 based on the oscillation signal in the oscillation loop, the oscillation driver circuit 10 can disable the operation of the AGC circuit 40 without disabling the operations of the GCA 20 and the comparator 50 (i.e., while enabling the operations of the GCA 20 and the comparator 50) when the oscillation driver circuit 10 is set in the sleep mode.

In this embodiment, the output from the comparator 50 is output as the synchronous detection clock signal in the steady oscillation state in the normal mode, for example. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable to make the gain of the comparator 50 as large as possible. This makes it possible to increase the loop gain in the oscillation loop formed during the oscillation startup state, whereby the oscillation startup time can be reduced. Moreover, the accuracy of the synchronous detection clock signal output during the steady oscillation state can be increased.

It is preferable that the polarity (inversion and noninversion) of the operational amplifier forming the GCA 20 be the same as the polarity of the operational amplifier forming the comparator 50. This makes it unnecessary to provide a circuit which reverses polarity, even if the oscillation loop is switched using the first and second switching elements SW1 and SW2, whereby an increase in the circuit scale can be suppressed.

Figure 7:
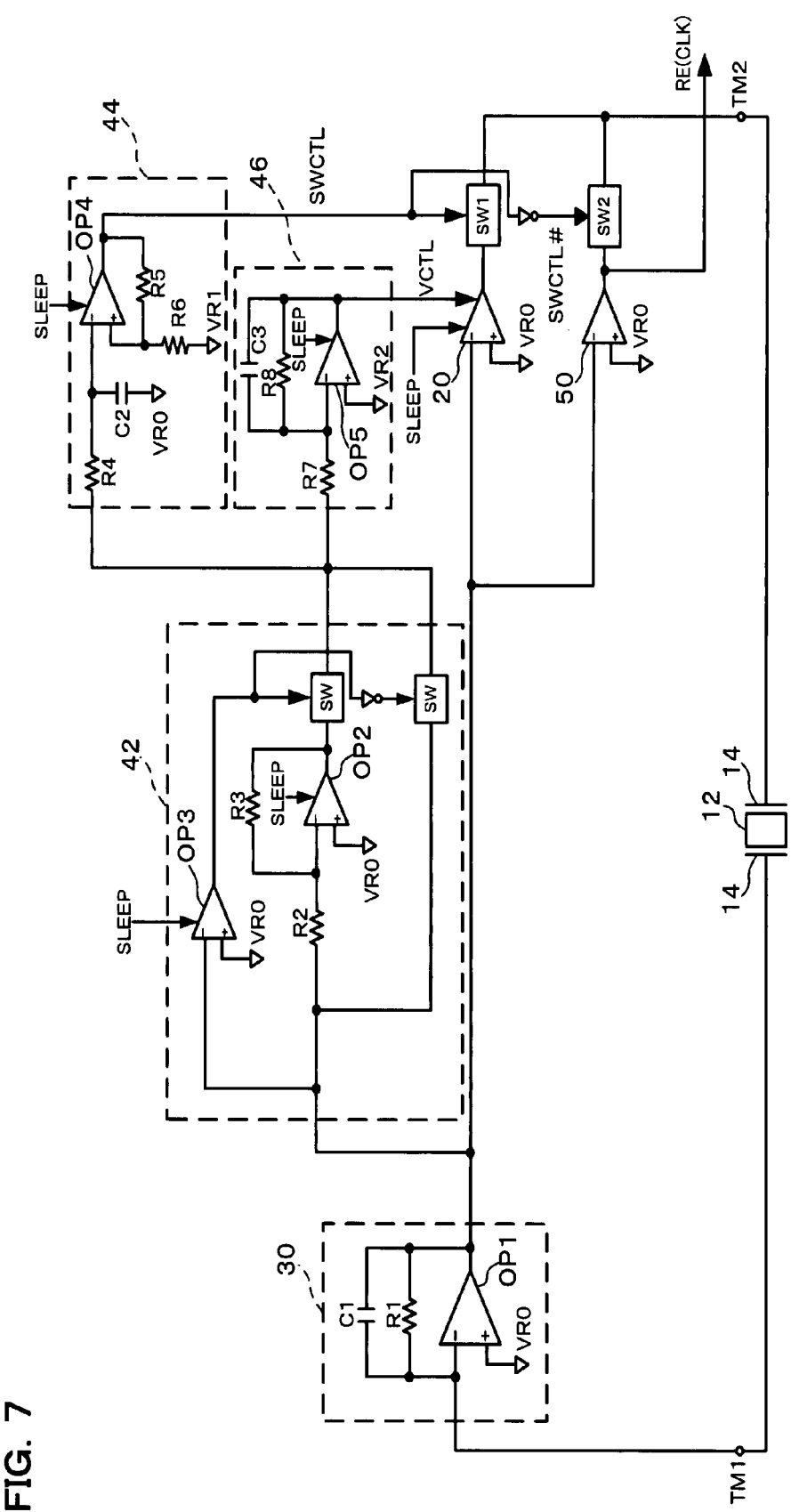
FIG. 7 is a view showing a circuit example of the oscillation driver circuit shown in FIG. 5.

FIG. 7 is a circuit diagram showing a configuration example of the oscillation driver circuit 10 shown in FIG. 4.

In FIG. 7, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3. When the sleep control signal SLEEP is set at the H level, the operations of the operational amplifiers OP2 and OP3 are stopped by terminating or limiting the operating currents of the operational amplifiers OP2 and OP3. When the sleep control signal SLEEP is set at the L level, the operational amplifiers OP2 and OP3 are caused to operate by generating the operating currents of the operational amplifiers OP2 and OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the switch control signal SWCTL. When the sleep control signal SLEEP is set at the H level, the operation of the operational amplifier OP4 is stopped by terminating or limiting the operating current of the operational amplifier OP4. When the sleep control signal SLEEP is set at the L level, the operational amplifier OP4 is caused to operate by generating the operating current of the operational amplifier OP4.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage V R2 is supplied to the non-inverting input terminal of the operational amplifier OP5. The integrator 46 functions as an LPF by the capacitor C3 and the resistor R8. The cut-off frequency is $1/(2\pi C3 \times R8)$. The output signal from the operational amplifier OP5 is supplied to the GCA 20 as the control signal VCTL. When the sleep control signal SLEEP is set at the H level, the operation of the operational amplifier OP5 is stopped by terminating or limiting the operating current of the operational amplifier OP5. When the sleep control signal SLEEP is set at the L level, the operational amplifier OP5 is caused to operate by generating the operating current of the operational amplifier OP5.

The current which flows toward the vibrator 12 in the oscillation startup state is indicated by Id, and the current which flows toward the vibrator 12 in the steady oscillation state is indicated by Id'. The reference voltage VR2 is expressed by the following equation taking into account the smoothing by the current-voltage converter 30, $$VR2 = (Id \times R1 \times 2/\pi) + VR0 \qquad (1)$$

where, R1 indicates the resistance value of the feedback resistor of the current-voltage converter 30. Likewise, the reference voltage VR1 is expressed by the following equation.

$$VR1=(Id'\times R1\times 2/\pi)+VR0 \tag{2}$$

Since Id'<Id, the reference voltage VR2 is higher than the reference voltage VR1. It is preferable that the reference voltages VR1 and VR2 have the following relationship with the reference voltage VR0.

$$VR0<VR1<VR2 \tag{3}$$

When the sleep control signal SLEEP is set at the H level, the operation of the GCA 20 is stopped by terminating or limiting the operating current of the GCA 20. When the sleep control signal SLEEP is set at the L level, the GCA 20 is caused to operate by generating the operating current of the GCA 20.

Figure 8A:
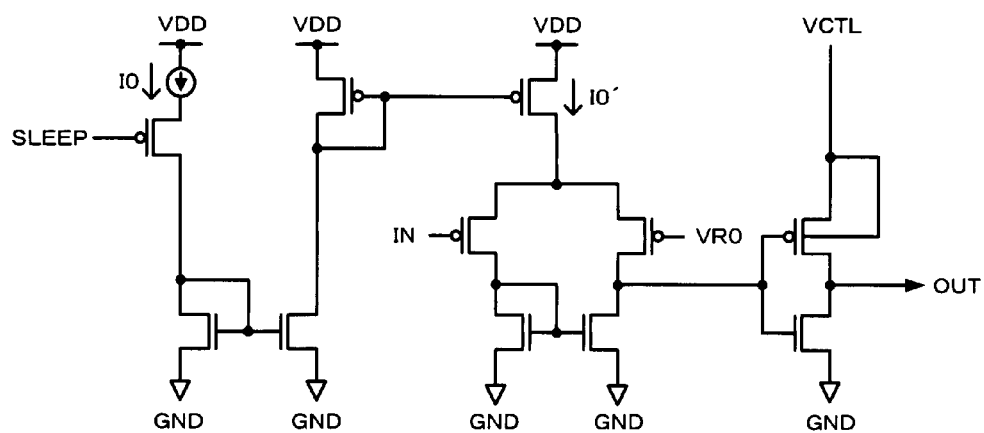
FIGS. 8A and 8B are circuit diagrams showing a configuration example of a gain control amplifier (GCA).
Figure 8B:
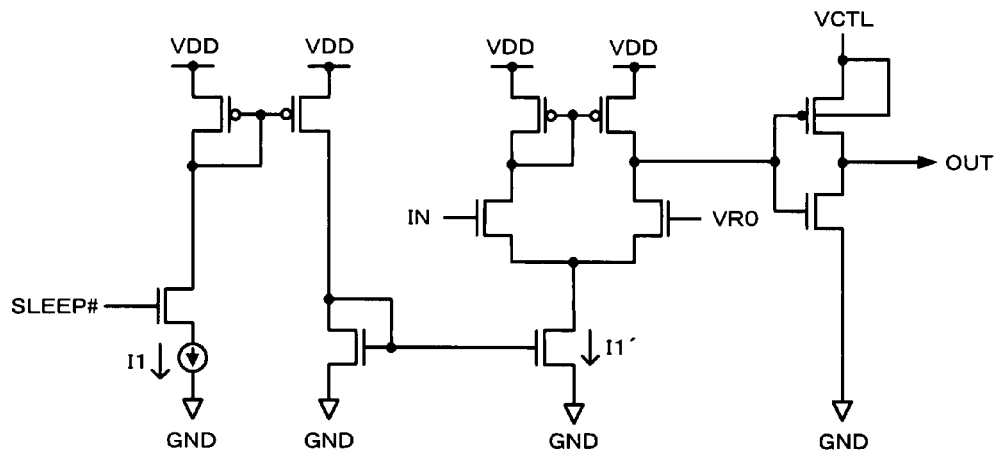

FIGS. 8A and 8B are circuit diagrams showing a configuration example of the GCA 20 shown in FIG. 3.

FIG. 8A shows a configuration example when forming the GCA 20 using a P-type differential amplifier, and FIG. 8B shows a configuration example when forming the GCA 20 using an N-type differential amplifier. In FIGS. 8A and 8B, the sleep control signal SLEEP # is an inversion signal of the sleep control signal SLEEP.

In FIG. 8A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The output signal from the output buffer is supplied to one end of the first switching element SW1.

The high-potential-side power supply voltage and the low-potential-side power supply voltage of the two current-mirror circuits and the P-type differential amplifier are respectively the voltage VDD and the voltage AGND. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIG. 8B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The output signal from the output buffer is supplied to one end of the first switching element SW1.

The high-potential-side power supply voltage and the low-potential-side power supply voltage of the two current-mirror circuits and the N-type differential amplifier are respectively the voltage VDD and the voltage AGND. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

In FIGS. 8A and 8B, a substrate bias effect can be prevented by applying the control signal VCTL as the substrate potential of the P-type output transistor of the output buffer.

In FIGS. 8A and 8B, a current control transistor is provided in series with the current source. In FIG. 8A, the current source transistor is formed of a P-type transistor, and the sleep control signal SLEEP is supplied to the gate of the transistor.

In FIG. 8B, the current source transistor is formed of an N-type transistor, and the sleep control signal SLEEP# is supplied to the gate of the transistor. According to the configurations shown in FIGS. 8A and 8B, the source and the drain of the current control transistor are electrically disconnected when the sleep control signal SLEEP is set at the H level, whereby the current generated by the current source is not supplied to the current-mirror circuit. Therefore, the operation of the GCA 20 can be disabled (stopped) based on the sleep control signal SLEEP.

The configuration of the oscillation driver circuit 10 is not limited to the configuration shown in FIG. 7.

For example, the operation of the AGC circuit 40 is stopped (disabled) in the sleep mode. In this case, the voltage of each node of the AGC circuit 40 is variable. In particular, when the potential of the control signal VCTL is variable, the output signal from the GCA 20 also becomes variable. Therefore, when the oscillation driver circuit 10 transitions from the sleep mode to the normal mode, the output signal from the GCA 20 becomes variable due to the control signal VCTL of which the level is variable.

As a result, the vibrator 12 is caused to produce driving vibrations using the variable output signal from the GCA 20. For example, when the vibrator 12 utilizes a piezoelectric effect, since the vibrator 12 operates in proportion to the charge supplied, the vibrator 12 may break due to an output signal which cannot be controlled. As a modification according to this embodiment, an output fixing transistor which fixes the output from the integrator 46 may be provided.

Figure 9:
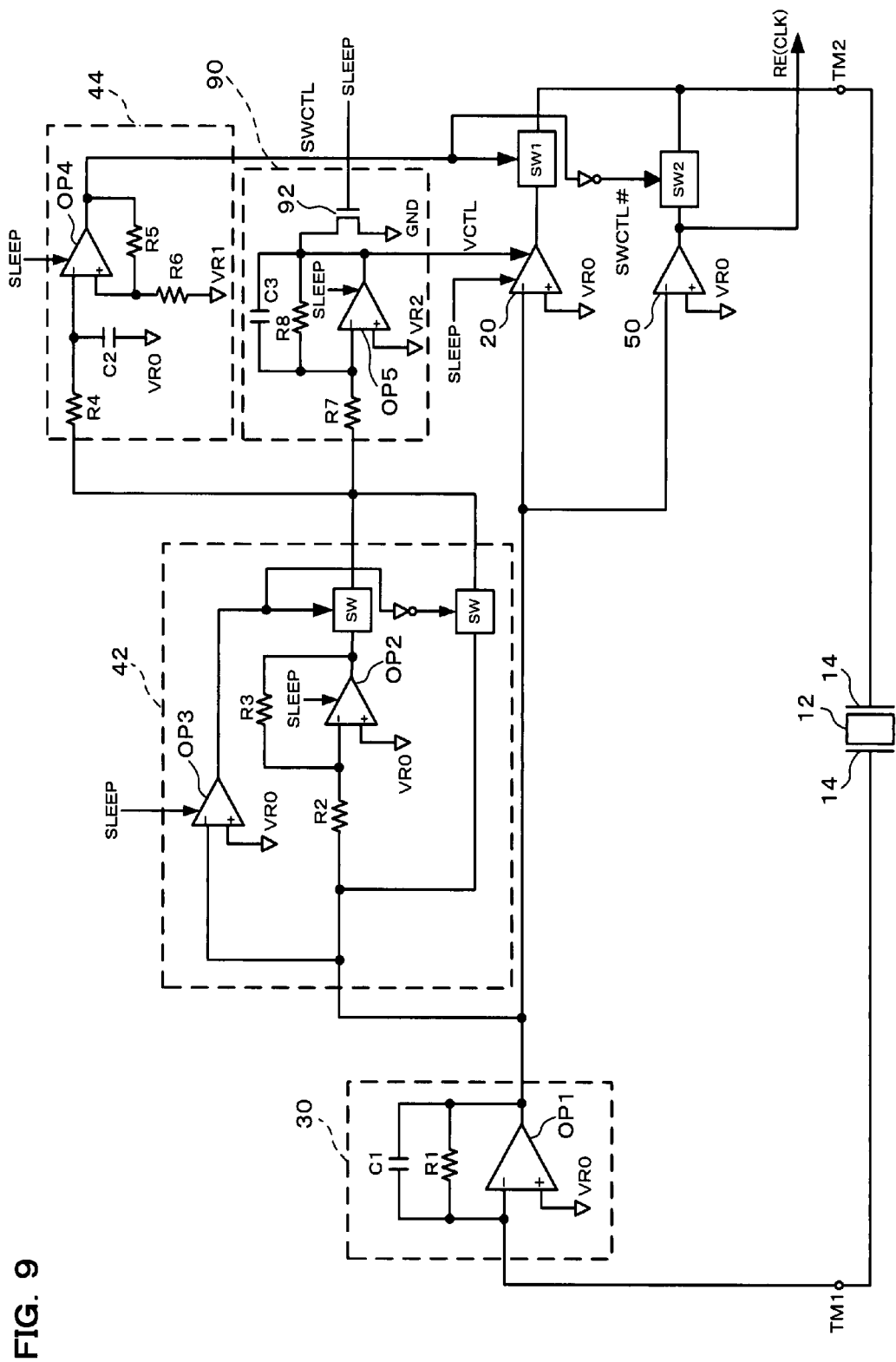
FIG. 9 is a circuit diagram showing another configuration example of the oscillation driver circuit shown in FIG. 5.

FIG. 9 is a circuit diagram showing another configuration example of the oscillation driver circuit 10 shown in FIG. 1.

In FIG. 9, the same sections as in FIG. 7 are indicated by the same symbols. Description of these sections is appropriately omitted. The oscillation driver circuit shown in FIG. 9 differs from the oscillation driver circuit 10 shown in FIG. 7 in that an integrator 90 is provided instead of the integrator 46 shown in FIG. 7.

The integrator 90 has a configuration in which an output fixing transistor 92 is added to the integrator 46 shown in FIG. 7.

The output fixing transistor 92 is formed of an N-type transistor. The output node of the operational amplifier OP5 is connected with the drain of the output fixing transistor 92, and the voltage AGND is supplied to the source of the output fixing transistor 92. The sleep control signal SLEEP is supplied to the gate of the output fixing transistor 92.

According to this configuration, the output fixing transistor 92 is set in a conducting state when the sleep control signal SLEEP is set at the H level so that the output node of the integrator 90 is set at the same potential as the voltage AGND. This causes the potential of the control signal VCTL to be fixed so that the output signal from the GCA 20 does not become variable, even when the oscillation driver circuit 10 transitions from the sleep mode to the normal mode, whereby a situation in which the vibrator 12 breaks can be reliably prevented.

In FIG. 9, the output of the integrator is fixed by providing the output fixing transistor. Note that the invention is not limited to the configuration shown in FIG. 8.

(Configuration and Operation of Vibrating Gyrosensor)

Figure 10:
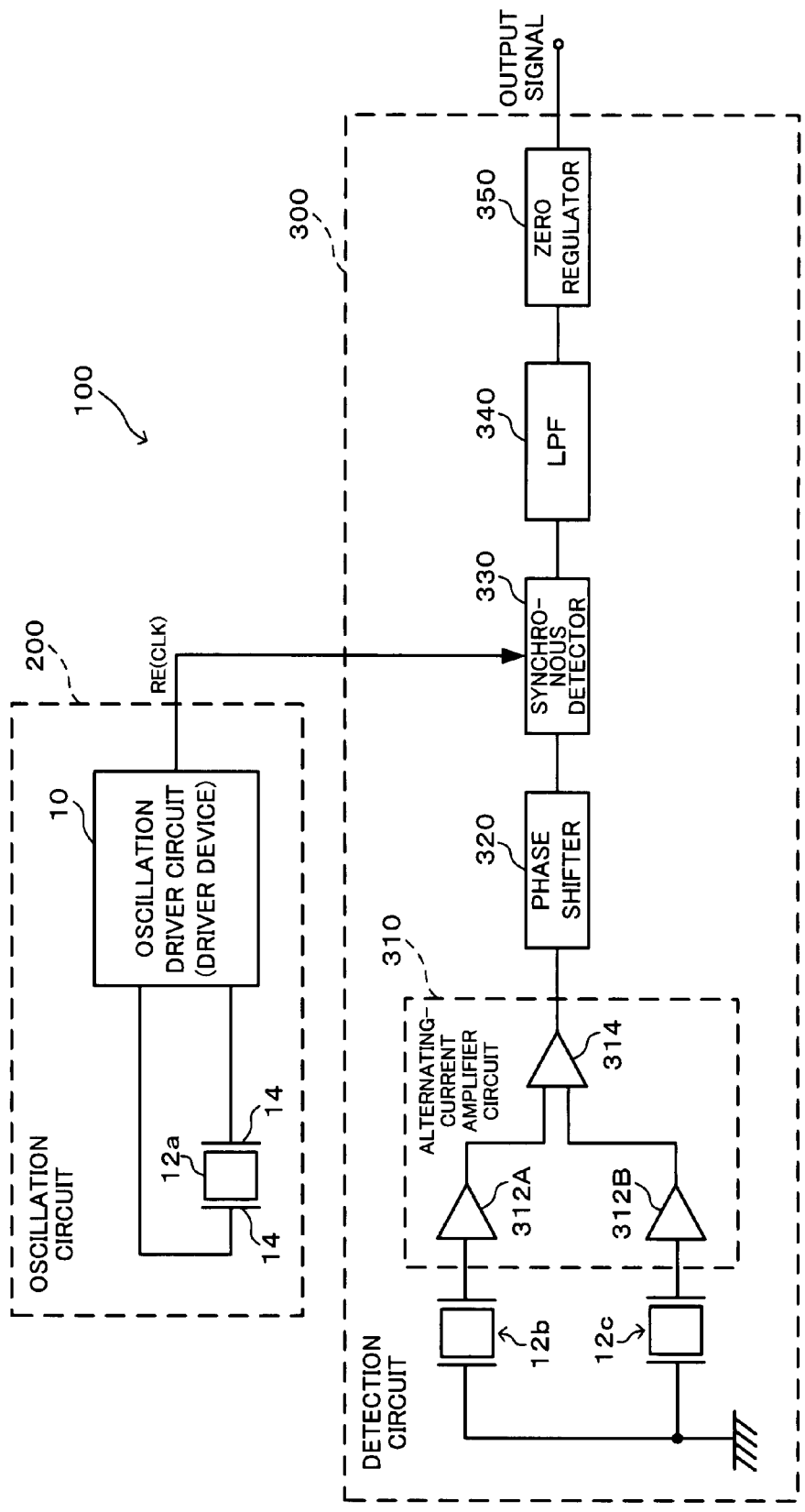
FIG. 10 is a block diagram showing a configuration example of a vibrating gyrosensor according to the second embodiment.

FIG. 10 is a block diagram showing a configuration example of a vibrating gyrosensor to which the oscillation driver circuit according to this embodiment (or its modification) is applied.

In FIG. 10, the sections as in FIG. 5 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12a of the vibrator 12 to oscillate.

During oscillation startup in the normal mode, the output from the comparator 50 is input to the oscillation driver circuit 10 as noise. The noise is subjected to frequency selection while passing through the driving vibration section 12a of the vibrator 12. The signal which has passed through the driving vibration section 12a is partially removed, input to the full-wave rectifier 42, and converted into an amplitude. The signal with the amplitude is input to the oscillation detector 44 to generate the switch control signal SWCTL. Since the amplitude of the signal subjected to frequency selection while passing through the vibrator 12a is small during the oscillation startup, the oscillation detector 44 generates the switch control signal SWCTL set at the L level.

The amplitude of the signal subjected to frequency selection while passing through the vibrator 12a increases immediately after oscillation startup in the normal mode, whereby the oscillation detector 44 generates the switch control signal SWCTL set at the H level. This causes the oscillation loop to be switched so that the amplitude of the signal subjected to frequency selection while passing through the vibrator 12a is controlled by the GCA 20. When most of the noise is cut off by the driving vibration section 12a and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

The vibrating gyrosensor is controlled in the sleep mode in the same manner as in the oscillation startup state in the normal mode.

When the oscillation state of the driving signal has been stabilized, signals from driving detection sections 12b and 12c of the vibrator 12 start to be detected. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed up by an adder 314.

The output from the adder 314 is caused to pass through a phase shifter 320 to obtain a phase shift signal. The phase of the phase shift signal differs from the phase of the synchronous detection clock signal which is the output from the comparator 50 of the oscillation driver circuit 10 by a specific angle such as 90°. The phase shift signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 10 is preferably provided in electronic instruments such as a video camera, a digital camera, a car navigation system, an aircraft, and a robot.

The invention is not limited to the vibrator 12 according to this embodiment. As examples of the material for the vibrator 12, constant modulus alloys such as elinvar and ferroelectric single crystals (piezoelectric single crystals) can be given. As examples of such single crystals, a crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to the angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator producing driving vibrations. As such a physical quantity, acceleration and angular acceleration are particularly preferred in addition to the angular velocity applied to the vibrator. As the detection device, an inertial sensor is preferred.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A driver device which is connected with a vibrator to form an oscillation loop and causes the vibrator to produce driving vibrations when measuring a physical quantity using an output signal obtained by synchronously detecting a detection signal output from the vibrator, the driver device comprising:

a gain control amplifier which causes the vibrator to produce the driving vibrations by controlling an oscillation amplitude in the oscillation loop; and a comparator which generates a synchronous detection reference signal based on a signal in the oscillation loop;

the driver device setting a gain in a first oscillation loop including the vibrator and the comparator to be larger than unity using an output from the comparator, and then causing the vibrator to produce the driving vibrations by controlling an oscillation amplitude in a second oscillation loop including the vibrator and the gain control amplifier.

2. The driver device as defined in claim 1, wherein the driver device causes the vibrator to produce vibrations using the first oscillation loop in an oscillation startup state, and causes the vibrator to produce vibrations using the second oscillation loop in a steady oscillation state.

3. The driver device as defined in claim 1,
wherein the driver device has a first operation mode and a second operation mode as operation modes;
wherein, when the driver device is set in the first operation mode, the driver device sets the gain in the first oscillation loop including the vibrator and the comparator to be larger than unity using the output from the comparator, and then causes the vibrator to produce the driving vibrations by controlling the oscillation amplitude in the second oscillation loop including the vibrator and the gain control amplifier; and
wherein, when the driver device is set in the second operation mode, the driver device causes the vibrator to produce the driving vibrations using the first oscillation loop including the vibrator and the comparator.

4. The driver device as defined in claim 3, wherein the first operation mode is a normal operation mode, and the second operation mode is a low power consumption mode.

5. The driver device as defined in claim 1, comprising:
an oscillation detector which detects a signal from the vibrator;
wherein the driver device switches the oscillation loop from the first oscillation loop including the vibrator and the comparator to the second oscillation loop including the vibrator and the gain control amplifier based on a detection result of the oscillation detector.

6. The driver device as defined in claim 5, wherein the driver device switches the oscillation loop from the first oscillation loop including the vibrator and the comparator to the second oscillation loop including the vibrator and the gain control amplifier based on a detection result of the oscillation detector on condition that the oscillation detector has detected that a direct-current voltage obtained by converting current flowing toward the vibrator has reached a given threshold voltage.

7. The driver device as defined in claim 1, wherein the driver device causes the vibrator to produce the driving vibrations using the output from the comparator when the first oscillation loop including the vibrator and the comparator is formed, and uses the output from the comparator as a synchronous detection clock signal for generating the output signal when the second oscillation loop including the vibrator and the gain control amplifier is formed.

8. The driver device as defined in claim 1, wherein the polarity of the output from the gain control amplifier is the same as the polarity of the output from the comparator.

9. The driver device as defined in claim 1, comprising:
an oscillation detector which detects a signal from the vibrator;
wherein, when the driver device is set in the first operation mode, the driver device switches the oscillation loop from the first oscillation loop including the vibrator and the comparator to the second oscillation loop including the vibrator and the gain control amplifier based on a detection result of the oscillation detector.

10. The driver device as defined in claim 9, wherein the driver device switches the oscillation loop from the first oscillation loop including the vibrator and the comparator to the second oscillation loop including the vibrator and the gain control amplifier based on a detection result of the oscillation detector on condition that the oscillation detector has detected that a direct-current voltage obtained by converting current flowing toward the vibrator has reached a given threshold voltage.

11. The driver device as defined in claim 3, comprising:
a gain control circuit which controls a gain of the gain control amplifier based on a voltage signal obtained by converting a current signal from the vibrator into a voltage signal;
wherein, when the driver device is set in the second operation mode, the driver device disables an operation of the gain control circuit without disabling operations of the gain control amplifier and the comparator.

12. The driver device as defined in claim 3, wherein the driver device causes the vibrator to produce the driving vibrations using the output from the comparator when the first oscillation loop including the vibrator and the comparator is formed, and uses the output from the comparator as a synchronous detection clock signal for generating the output signal when the second oscillation loop including the vibrator and the gain control amplifier is formed.

13. The driver device as defined in claim 3, wherein the polarity of the output from the gain control amplifier is the same as the polarity of the output from the comparator.

14. A physical quantity measuring device for measuring a physical quantity corresponding to a detection signal output from a vibrator based on driving vibrations produced by the vibrator and the physical quantity to be measured, the physical quantity measuring device comprising:
a vibrator;
the driver device as defined in claim 1 which causes the vibrator to produce driving vibrations; and
a detection device which detects an output signal corresponding to the physical quantity based on the detection signal,
the detection device including a synchronous detector which synchronously detects the detection signal based on the output from the comparator.

15. The physical quantity measuring device as defined in claim 14, wherein the detection device includes a phase shifter which adjusts the phases of the output from the comparator and the detection signal.

16. An electronic instrument comprising the physical quantity measuring device as defined in claim 14.

17. A physical quantity measuring device for measuring a physical quantity corresponding to a detection signal output from a vibrator based on driving vibrations produced by the vibrator and the physical quantity to be measured, the physical quantity measuring device comprising:
a vibrator;
the driver device as defined in claim 3 which causes the vibrator to produce driving vibrations; and
a detection device which detects an output signal corresponding to the physical quantity based on the detection signal, the detection device including a synchronous detector which synchronously detects the detection signal based on the output from the comparator.

18. The physical quantity measuring device as defined in claim 17, wherein the detection device includes a phase shifter which adjusts phases of the output from the comparator and the detection signal.

19. An electronic instrument comprising the physical quantity measuring device as defined in claim 17.

20. The driver device as defined in claim 1,
wherein the vibrator is a capacitive-coupling vibrator; and
wherein the gain control amplifier causes the vibrator to produce the driving vibrations by applying a rectangular-wave driving signal to the vibrator.

* * * * *